United States Patent
Otsuka et al.

(10) Patent No.: US 7,102,468 B2
(45) Date of Patent: Sep. 5, 2006

(54) SURFACE ACOUSTIC WAVE DEVICE AND COMMUNICATION APPARATUS USING THE SAME

(75) Inventors: Kazuhiro Otsuka, Kyoto (JP); Motoki Ito, Kyoto (JP); Kiyohiro Iioka, Kyoto (JP); Tsuyoshi Nakai, Kyoto (JP)

(73) Assignee: Kyocera Corporation, Kyoto (JP)

( * ) Notice: Subject to any disclaimer, the term of this patent is extended or adjusted under 35 U.S.C. 154(b) by 173 days.

(21) Appl. No.: 10/884,827

(22) Filed: Jul. 2, 2004

(65) Prior Publication Data

US 2005/0001696 A1 Jan. 6, 2005

(30) Foreign Application Priority Data

Jul. 2, 2003 (JP) ............................. 2003-190636

(51) Int. Cl.
*H03H 9/64* (2006.01)
*H03H 9/72* (2006.01)

(52) U.S. Cl. ........................ 333/195; 333/133
(58) Field of Classification Search ................. 333/195
See application file for complete search history.

(56) References Cited

U.S. PATENT DOCUMENTS

| | | | | |
|---|---|---|---|---|
| 4,635,009 A * | 1/1987 | Ebata | ............... | 333/195 |
| 6,420,946 B1 | 7/2002 | Bauer et al. | ............... | 333/193 |
| 6,583,691 B1 | 6/2003 | Takamine | ............... | 333/195 |
| 6,621,380 B1 * | 9/2003 | Takamine | ............... | 333/195 |
| 6,744,333 B1 * | 6/2004 | Sawada | ............... | 333/133 |
| 6,771,144 B1 * | 8/2004 | Takamine | ............... | 333/133 |
| 2002/0017969 A1 | 2/2002 | Takamine | ............... | 333/193 |
| 2004/0108918 A1 | 6/2004 | Tsunekawa et al. | ......... | 333/195 |

FOREIGN PATENT DOCUMENTS

| | | | |
|---|---|---|---|
| DE | 41 26 335 A1 * | 2/1993 | ............... 333/195 |
| EP | 1 453 197 | 9/2004 | |
| JP | 64-019815 | 1/1989 | |
| JP | 01-231417 | 9/1989 | |
| JP | 04-040705 | 2/1992 | |
| JP | 07-058581 | 3/1995 | |
| JP | 08-250969 | 9/1996 | |
| JP | 2002-009587 | 1/2002 | |
| JP | 2002-528987 | 9/2002 | |
| JP | 2003-115746 | 4/2003 | |
| WO | 03/003574 | 1/2003 | |
| WO | 03/050949 | 6/2003 | |

\* cited by examiner

*Primary Examiner*—Barbara Summons
(74) *Attorney, Agent, or Firm*—Hogan & Hartson LLP

(57) ABSTRACT

IDT electrodes are arranged on a piezoelectric substrate along a propagation direction of a surface acoustic wave whereas reflectors are each interposed between a respective pair of IDT electrodes, the reflectors each including four or more electrode fingers extended perpendicularly to the propagation direction. An electrode-finger pitch 'a' of the reflector is progressively decreased from the opposite ends of the reflector toward the center thereof. Frequencies allowed to pass through a pass band may be controlled by varying the electrode-finger pitch. Thus is provided a surface acoustic wave device featuring a wide-band transmission performance.

22 Claims, 29 Drawing Sheets

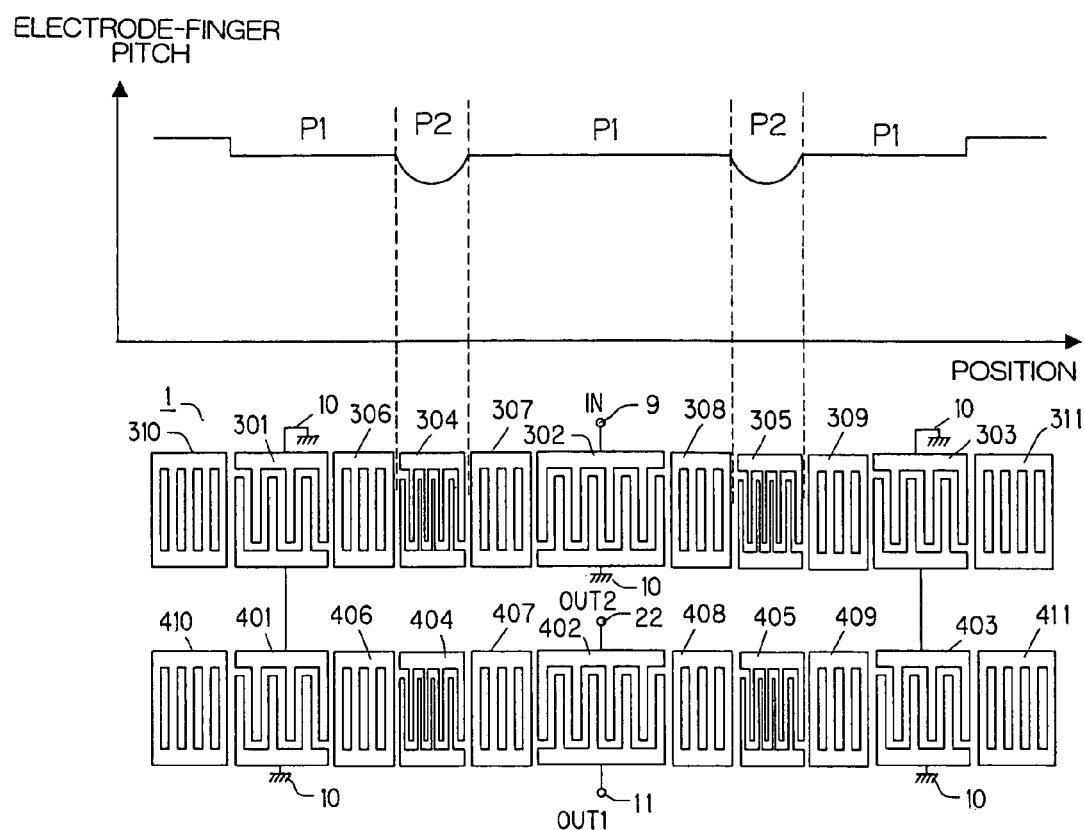

SURFACE ACOUSTIC WAVE DEVICE AND COMMUNICATION APPARATUS USING THE SAME

This application is based on application Nos. 2003-190636 filed in Japan, the content of which is incorporated herein by reference.

BACKGROUND OF THE INVENTION

1. Field of the Invention

The present invention relates to a surface acoustic wave device and a communication apparatus, such as a cellular phone, employing the same.

2. Description of the Related Art

Surface acoustic wave devices incorporating SAW (Surface Acoustic Wave) filters have been used in a variety of communication apparatuses.

As the modern communication apparatuses have become more compact, adapted for higher-frequency operations, and more functional, there arises an increasing demand for widening the pass bandwidth of the SAW filter. For instance, a high-performance wide-band filter having an effective pass bandwidth of not less than 80 MHz (a fractional bandwidth of about 4% or more) is desired as a filter for use in a cellular phone operating in a transmission band of 1.9 GHz. It is noted here that the "fractional bandwidth" means a value given by dividing the effective pass bandwidth by the center frequency of the passband.

For achieving such a wide-band transmission, there has been proposed a double-mode SAW resonator filter which includes three IDT (Inter Digital Transducer) electrodes formed on a piezoelectric substrate and utilizes a first-order and third-order longitudinal modes.

FIG. 22 is a plan view showing an electrode configuration of a conventional resonator-type SAW filter. IDT electrodes 202, 203, 204 arranged on a piezoelectric substrate 201 each comprise a pair of comb electrodes opposing to each other. A surface acoustic wave is generated by applying an electric field to the pair of comb electrodes. A signal is inputted to the central IDT electrode 203 via an input terminal 210 connected to one of the comb electrodes thereof, thereby causing propagation of an excited surface acoustic wave to the IDT electrodes 202, 204 disposed on the opposite sides of the IDT electrode 203. The signal is transmitted from a respective one of the comb electrodes constituting the individual IDT electrodes 202, 204 to an output terminal 213 via IDT electrodes 206, 208 and an IDT electrode 207, so that the output terminal provides an output. Thus, the resonator-type electrode patterns may be interconnected in two-stage cascade connection fashion so as to achieve an increased amount of out-of-band attenuation as filter characteristics. In the figure, reference numerals 205, 209 each represent a reflector, whereas a reference numeral 211 represents a ground terminal.

Likewise to FIG. 22, FIG. 23 is a plan view showing an electrode configuration of a conventional SAW filter. The filter includes IDT electrodes 102, 103, 104 and a reflector 107 formed on a piezoelectric substrate 101. In the figure, reference numerals 105, 106 each represent an inter-electrode portion defined between adjoining IDT electrodes, a reference numeral 108 representing an inter-electrode portion defined between the IDT electrode 103, 104 and the reflector 107, a reference numeral 111 representing an input terminal, a reference numeral 112 representing a ground terminal, a reference numeral 113 representing an output terminal.

The surface acoustic wave is excited by inputting a signal to the input terminal 111 connected to the IDT electrode 102. The surface acoustic wave is propagated to the IDT electrodes 103, 104 on the opposite sides of the IDT electrode 102, so that the signal is outputted from the output terminal 113 connected to the IDT electrodes 103, 104. The surface acoustic wave is reflected by the reflectors 107 on the opposite ends of the filter, thereby forming a standing wave.

The mode of the standing wave includes a first-order mode and a higher-order mode (third-order mode) because of the presence of the three IDT electrodes 102, 103, 104. The pass characteristics of the filter depend upon resonances generated in these modes. Hence, the filter may be broadened in the passband by controlling a distance between the resonant frequencies occurring in these modes.

Conventionally, the distance between the resonant frequencies is controlled as follows. While all the IDT electrodes 102, 103, 104 are so configured as to have the same center-to-center distance (pitch L) between respective pairs of adjoining electrode fingers, the distance between the resonant frequencies is controlled by controlling a distance 'd' between adjoining IDT electrodes.

According to the aforementioned control method, the conventional double-mode SAW resonator filter employing a $LiTaO_3$ substrate as the piezoelectric substrate thereof can achieve a fractional bandwidth of about 0.40% (see, Japanese Unexamined Patent Publication No. 1-231417) or, at most, of about 2% (see, Japanese Unexamined Patent Publication No. 4-40705). Although the conventional filter has achieved the maximum fractional bandwidth of 3.7% (see, Japanese Unexamined Patent Publication No. 7-58581), temperature variations must be taken into consideration when the filter is in actual operations. Furthermore, the filter is prone to frequency variations due to the variations in the configuration of the formed electrodes. Accordingly, it is impracticable to apply the conventional double-mode SAW filter to the communication apparatuses, such as the cellular phones, which require a broad pass bandwidth.

In addition, the following attempt has been made to broaden the passband and to reduce the insertion loss. A narrow electrode-finger pitch portion (the inter-electrode portion 105, 106 between the adjoining IDT electrodes shown in FIG. 23) is provided between the respective ends of the adjoining IDT electrodes, thereby reducing radiation loss into a bulk wave, the loss occurring at place between the IDT electrodes. In this state, a resonant mode is conditioned such that the filter may achieve a broader pass bandwidth and a reduced insertion loss (see, Japanese Unexamined Patent Publication No. 2002-009587 and Published Japanese Translation of PCT International Publication for Patent Application No. 2002-528987).

However, the piezoelectric substrate encounters a pyroelectric effect caused by temperature fluctuations during the fabrication process, so that the electric charges concentrate on the narrow pitch portion between the IDT electrodes. The narrow pitch portion may encounter electric discharge caused by potential difference between the electrode fingers and hence, the IDT electrode may be damaged.

It is an object of the invention to provide a surface acoustic wave device having excellent filter characteristics featured by a low insertion loss and a broad passband, as well as to provide a communication apparatus using the same.

BRIEF SUMMARY OF THE INVENTION

A surface acoustic wave device according to the invention includes a plurality of IDT electrodes arranged on a piezoelectric substrate along a propagation direction of a surface acoustic wave propagated on the piezoelectric substrate, the IDT electrode including a plurality of strip-line electrode fingers (hereinafter, referred to simply as "electrode fingers") extended perpendicularly to the propagation direction. The device may comprise one or more electrode stages laid in parallel, the stage comprising an array of the IDT electrodes. In addition, a reflector is interposed between a pair of IDT electrodes closely spaced from each other along the propagation direction, the reflector including four or more electrode fingers extended perpendicularly to the propagation direction. The device is characterized in that a center-to-center distance (pitch 'a' shown in FIG. 1; hereinafter, referred to as "electrode-finger pitch") between adjoining electrode fingers of the reflector is progressively decreased from electrode fingers at the opposite ends of the reflector toward a central electrode finger thereof.

A surface acoustic wave device according to the invention comprises a plurality of IDT electrodes arranged on a piezoelectric substrate along a propagation direction of a surface acoustic wave propagated on the piezoelectric substrate, the IDT electrode including a plurality of electrode fingers extended perpendicularly to the propagation direction. The device may comprise one or more electrode stages laid in parallel, the stage comprising an array of the IDT electrodes. A reflector is interposed between a pair of IDT electrodes closely spaced from each other along the propagation direction, the reflector including electrode fingers extended perpendicularly to the propagation direction. The device is characterized in that the electrode-finger pitch of the IDT electrode is progressively decreased from a region away from the reflector toward a region close to the reflector.

A surface acoustic wave device according to the invention comprises: five or more IDT electrodes each including electrode fingers extended perpendicularly to a propagation direction of a surface acoustic wave; and a reflector interposed between a pair of IDT electrodes closely spaced from each other along the propagation direction of the surface acoustic wave and including four or more electrode fingers extended perpendicularly to the propagation direction, wherein out of the five or more IDT electrodes, a central IDT electrode and outermost IDT electrodes have an equal electrode-finger pitch, and wherein an IDT electrode (referred to simply as "second IDT electrode") between the central IDT electrode and the outermost IDT electrode has an electrode-finger pitch which is smaller than the electrode-finger pitch of the central IDT electrode and of the outermost IDT electrodes and is progressively decreased from the opposite ends of the second IDT electrode toward the center thereof.

According to the aforementioned surface acoustic wave devices of the invention, a standing wave mode of the surface acoustic wave excited by the IDT electrodes or the frequencies thereof allowed to pass through a passband may be controlled by varying the electrode-finger pitch of the IDT electrodes or the reflector interposed between the IDT electrodes. That is, the configurations of the invention provide fine adjustment of the first-order mode frequencies, the third-order mode frequencies and the frequencies between these modes. Thus are provided the surface acoustic wave devices featuring a wide-band transmission performance.

Furthermore, the invention also offers the following effects.

For reference purpose, FIG. 24A shows an energy distribution of a standing wave in a resonator-type SAW filter wherein a reflector having an equal electrode-finger pitch is interposed between the IDT electrodes shown in FIG. 22. On the other hand, FIG. 24B shows an energy distribution of a standing wave in the resonator-type SAW filter of the invention. As shown in FIG. 24A, the distribution of energy E of the standing wave in the resonator-type electrode pattern of the resonator-type SAW filter as the reference example contains plural peaks (energy fluctuations). The fluctuations in the distribution of energy E indicate that radiation loss associated with the wave propagation from the surface of the piezoelectric substrate into the depth thereof or the radiation loss from the surface wave into the bulk wave occurs at place between adjoining IDT electrodes. On the other hand, the invention adopts the configuration wherein the reflector (represented by R in FIG. 24B) is interposed between the closely spaced IDT electrodes and the electrode-finger pitch of the reflector R and/or of the IDT electrode is varied, thereby attaining a relatively smooth distribution of energy E of the standing wave, as shown in FIG. 24B. This results in an effect to confine the energy of the surface acoustic wave to the surface of the piezoelectric substrate so that the radiation loss of the surface acoustic wave from the surface wave into the bulk wave may be prevented. That is, a surface acoustic wave device featuring a transmission performance of low loss may be provided.

According to the invention, the configuration is made such that the electrode-finger pitch is varied in a region within the reflector or the IDT electrode, so as to eliminate an abruptly narrowed space between the electrode fingers in the region. This configuration is less prone to the electric discharge caused by an increased magnitude of the electric field between the electrode fingers. Hence, the IDT electrode is less susceptible to pyroelectrical breaking.

In one aspect of the invention, a surface acoustic wave device featuring a more favorable transmission performance may be provided if a configuration is made such that as to the reflector and IDT electrode in adjoining relation with respect to the propagation direction, the maximum value of the electrode-finger pitch of the reflector is smaller than an average value of the electrode-finger pitch of the IDT electrode. Thus is offered a surface acoustic wave filter of high quality, which achieves a broadened pass bandwidth as filter characteristics.

In a case where plural stages of resonator-type electrode similar patterns are provided in parallel, there may be provided a surface acoustic wave device which is excellent in the insertion loss, amplitude balance and phase balance and is increased in the pass bandwidth.

In a case where the reflector and the IDT electrode adjoining each other along the propagation direction are electrically interconnected, the electric charges are excited symmetrically about the center of the standing wave mode of multiple reflection so that an even more preferred transmission performance may be achieved.

In a case where a different resonator-type electrode pattern including one or more IDT electrodes for mode resonance generation and reflectors sandwiching the IDT electrode between there is connected in series or in parallel to the above resonator-type electrode pattern, the pass bandwidth as the filter characteristics may be broadened so that a surface acoustic wave filter featuring a high quality and a low insertion loss may be provided. A ladder-type circuit, in particular, may be formed so as to accomplish impedance matching between input and output, whereas an attenuation pole may be formed. Thus is provided an excellent surface acoustic wave device featuring a great amount of out-of-band attenuation.

An alternative configuration may be made such that one of a comb electrode pair constituting the IDT electrode and including plural electrode fingers in opposing relation is divided and the divided comb-electrode portions each define an electrode connected to a balanced signal for input or output. Thus is provided a surface acoustic wave device having a function as an unbalanced-balanced signal converter.

A communication apparatus according to the invention comprises a receiver circuit and/or a transmitter circuit incorporating the aforementioned surface acoustic wave device, thereby achieving a dramatically enhanced level of signal separation.

BRIEF DESCRIPTION OF THE DRAWINGS

FIG. 18A is a plan view schematically showing an exemplary electrode configuration wherein IDT electrodes 304, 305, 404, 405 have a smaller electrode-finger pitch P2 than an electrode-finger pitch P1 of a central IDT electrode 302, 402 and the outermost IDT electrodes 301, 303, 401, 403;

DETAILED DESCRIPTION OF THE INVENTION

Figure 1:
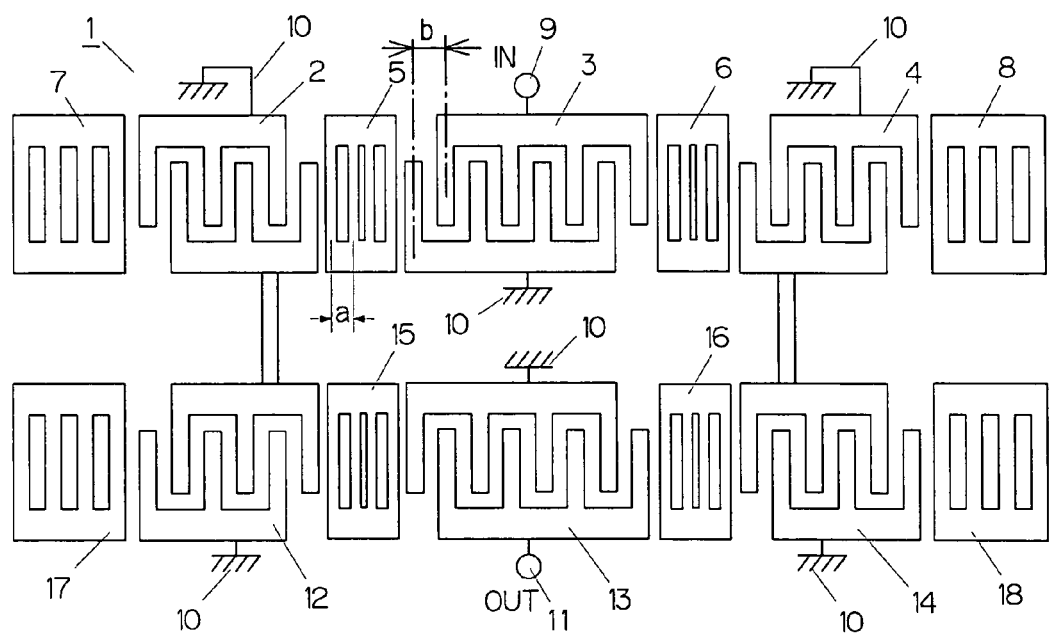
FIG. 1 is a plan view schematically showing an exemplary electrode configuration of a surface acoustic wave device of a multi-mode resonator type wherein an electrode-finger pitch of a reflector is progressively decreased from electrode fingers at the opposite ends thereof toward a central electrode finger thereof.

A surface acoustic wave device according to the invention will be described hereinbelow by way of examples of a resonator-type SAW filter. In the figures illustrated as below, like components are represented by the same reference numerals, respectively.

FIG. 1 is a plan view schematically showing an exemplary electrode configuration of a surface acoustic wave device of a multi-mode resonator type according to the invention.

As shown in FIG. 1, the SAW filter comprises a piezoelectric substrate 1 and IDT electrodes arranged on the piezoelectric substrate 1 along a propagation direction of a surface acoustic wave propagated on the piezoelectric substrate 1, the IDT electrode including a plurality of electrode fingers extended perpendicularly to the propagation direction.

The IDT electrodes are arranged in plural stages (two stages are shown in the figure). Each of the stages includes IDT electrodes 2, 3, 4 and IDT electrodes 12, 13, 14.

A reflector is interposed between a respective pair of IDT electrodes closely spaced from each other with respect to the aforesaid propagation direction (between the IDT electrodes 2 and 3, the IDT electrodes 3 and 4, the IDT electrodes 12 and 13, and the IDT electrodes 13 and 14). The reflector comprises an electrode including four or more electrode fingers extended perpendicularly to the aforesaid propagation direction. Specifically, a reflector 5 is interposed between the IDT electrodes 2 and 3; a reflector 6 is interposed between the IDT electrodes 3 and 4; a reflector 15 is interposed between the IDT electrodes 12 and 13; and a reflector 16 is interposed between the IDT electrodes 13 and the 14.

In addition, the IDT electrodes 2, 4 in the first stage are connected to the IDT electrodes 12, 14 in the second stage, respectively. A reference numeral 9 represents an input terminal; a reference numeral 10 represents a ground terminal; and a reference numeral 11 represents an output terminal.

As shown in the figure, at least one of the reflectors 5, 6, 15, 16 has an electrode-finger pitch 'a' progressively decreased from the electrode fingers at the opposite ends thereof toward a central electrode finger thereof.

On the other hand, reflectors 7, 8, 17, 18 configured to have a constant electrode-finger pitch are disposed at the opposite ends of these resonator-type electrode patterns.

As to the reflector and the IDT electrode in adjoining relation with respect to the aforesaid propagation direction, the maximum value of the electrode-finger pitch 'a' of the reflector is smaller than an electrode-finger pitch 'b' of IDT electrode.

As described above, the configuration of the invention accomplishes multiple reflection by inserting the reflector between the IDT electrodes.

In at least one of the reflectors interposed between the IDT electrodes, the electrode-finger pitch 'a' is progressively decreased from the electrode fingers at the opposite ends of the reflector toward the central electrode finger thereof. Thus is reduced a radiation loss into a bulk wave. As a result, the SAW filter may have an increased pass bandwidth as filter characteristics. Furthermore, the filter may achieve improvement in insertion loss. Accordingly, the SAW filter of high quality may be provided.

This result is effected even more remarkably in a case where as to the reflector and the IDT electrode in adjoining relation with respect to the propagation direction of the surface acoustic wave, the maximum electrode-finger pitch 'a' of the reflector is smaller than the electrode-finger pitch 'b' of the IDT electrode adjacent thereto.

On the other hand, an attenuation pole may be formed by interconnecting the resonator-type electrode patterns in two-stage configuration, wherein the electrode-finger pitch may be adjusted so as to provide control of the filter characteristics in a desired manner to satisfy specification requirements. The plural resonator-type electrode patterns may be designed to vary the electrode-finger pitch between the patterns, thereby forming plural attenuation poles or providing control of the formation of the attenuation poles. This provides for a design satisfying a higher level of specification requirements.

Incidentally, the IDT electrodes 2, 3, 4, 12, 13, 14; the reflectors 7, 8, 17, 18; and the reflectors 5, 6, 15, 16 interposed between the IDT electrodes each include the electrode fingers in the range of several to several hundreds. For simplicity purpose, therefore, the figure depicts the configurations of these components schematically. The following figures resemblant to FIG. 1 schematically show SAW filters to be described hereinafter.

Figure 2:
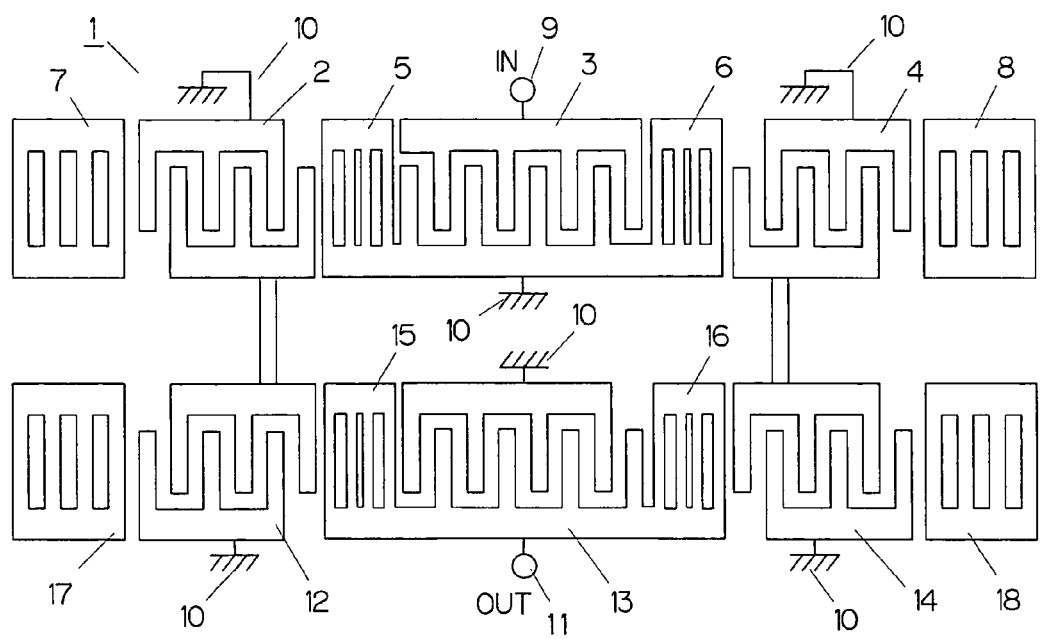
FIG. 2 is a plan view schematically showing an exemplary electrode configuration wherein reflectors 5, 6 and an IDT electrode 3 are electrically interconnected.

In contrast to the SAW filter of FIG. 1, a SAW filter shown in FIG. 2 is configured such that the reflectors 5, 6 are electrically connected with a ground electrode of the IDT electrode 3, the reflectors 5, 6 and the IDT electrode in adjoining relation with respect to the propagation direction of the surface acoustic wave.

Specifically, the first stage of resonator-type electrode pattern on the piezoelectric substrate 1 includes the IDT electrodes 2, 3, 4, whereas the second stage of resonator-type electrode pattern on the piezoelectric substrate 1 includes the IDT electrodes 12, 13, 14. The reflectors 5, 6 are interposed between the IDT electrodes 2 and 3, and the IDT electrodes 3 and 4, respectively, the reflectors each including electrode fingers extended perpendicularly to the propagation direction of the surface acoustic wave. On the other hand, the reflectors 15, 16 are interposed between the IDT electrodes 12 and 13, and the IDT electrodes 13 and 14, respectively, the reflectors each including electrode fingers elongated perpendicularly to the propagation direction of the surface acoustic wave.

Similarly to FIG. 1, the reflectors 5, 6, 15, 16 for multiple reflection are each configured such that the electrode-finger pitch 'a' is progressively decreased from the opposite ends of the electrode finger group thereof toward the central electrode finger thereof. The configuration is adapted to excite the electric charges symmetrical about the center of a standing wave mode.

In the first stage of resonator-type electrode pattern, the reflectors 5, 6 have their electrode fingers connected with a ground-side bus bar of the central IDT electrode 3 adjoining these reflectors, the bus bar connected with the individual electrode fingers constituting the IDT electrode 3. In the second stage of resonator-type electrode pattern, the reflectors 15, 16 have their electrode fingers connected with an output-side bus bar of the central IDT electrode 13 adjoining these reflectors.

Figure 3:
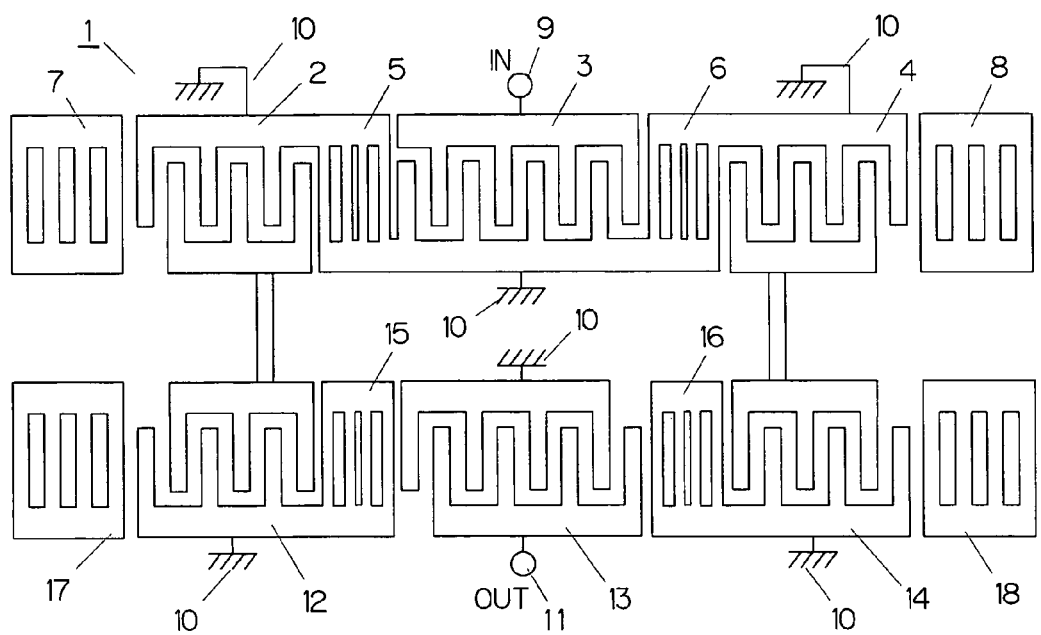
FIG. 3 is a plan view schematically showing an exemplary electrode configuration wherein the reflectors 5, 6 and IDT electrodes 2, 3, 4 are electrically interconnected.

FIG. 3 illustrates an exemplary modification of the configuration of FIG. 2. While the electrode patterns are generally configured the same way as those of FIG. 2, a resonator-type electrode pattern of the first stage is configured such that the reflector 5 interposed between the IDT electrodes 2 and 3 is electrically connected not only with the bus bar of the IDT electrode 3 but also with a bus bar of the IDT electrode 2. Similarly, the reflector 6 interposed between the IDT electrodes 3 and 4 is electrically connected not only with the bus bar of the IDT electrode 3 but also with a bus bar of the IDT electrode 4.

In a resonator-type electrode pattern of the second stage, the reflector 15 interposed between the IDT electrodes 12 and 13 is electrically connected with the IDT electrode 12 rather than with the IDT electrode 13, unlike the reflector shown in FIG. 2. Similarly, the reflector 16 interposed between the IDT electrodes 13 and 14 is electrically connected with the IDT electrode 14 rather than with the IDT electrode 13. Furthermore, each of the reflectors 5, 6, 15, 16 for multiple reflection has a configuration wherein the electrode-finger pitch is progressively decreased from the electrode fingers at the opposite ends thereof toward the central electrode finger thereof.

The connection between each of the reflectors 5, 6, 15, 16 and the bus bar of the IDT electrode may be implemented in either configurations which connects the reflector with one of the bus bars of the IDT electrode and which connects the reflector with both of the bus bars of the IDT electrode, unless the ground terminal shorts with the input/output terminal. The first stage and the second stage may adopt the same interconnection mode or different interconnection modes.

Figure 4:
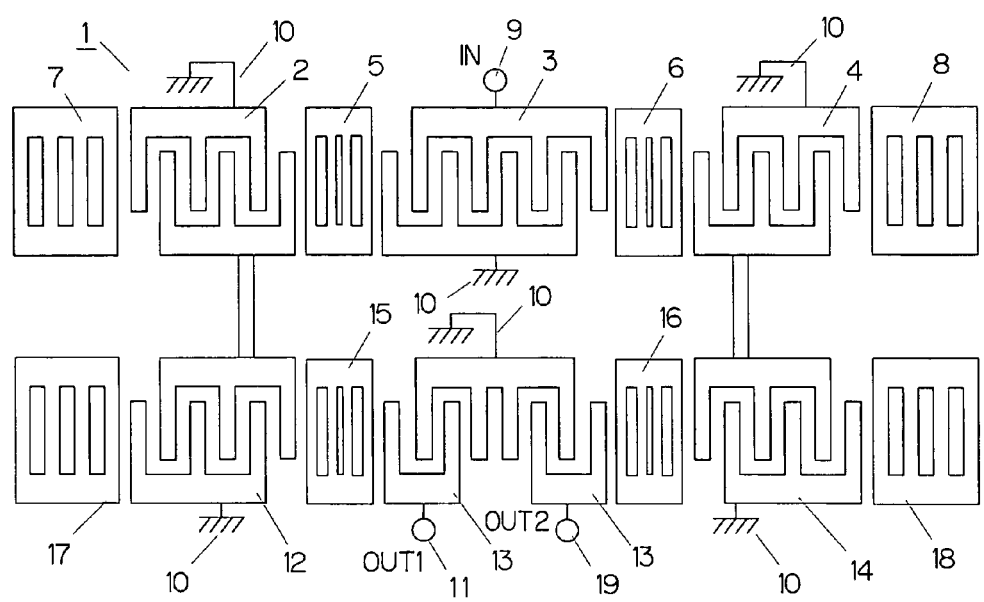
FIG. 4 is a plan view schematically showing an exemplary electrode configuration wherein one of a comb electrode pair constituting a central IDT electrode 13 is divided into two parts for providing balanced input/outputs.

A SAW filter shown in FIG. 4 is essentially based on the electrode configuration of FIG. 1, but has the following feature. In the central IDT electrode 13 of the second stage of the resonator-type SAW filter, one of the comb electrode pair constituting the IDT electrode is divided into two parts so as to provide balanced input/outputs. Incidentally, a reference numeral 19 in the figure represents an output terminal paired with the output terminal 11.

Figure 5:
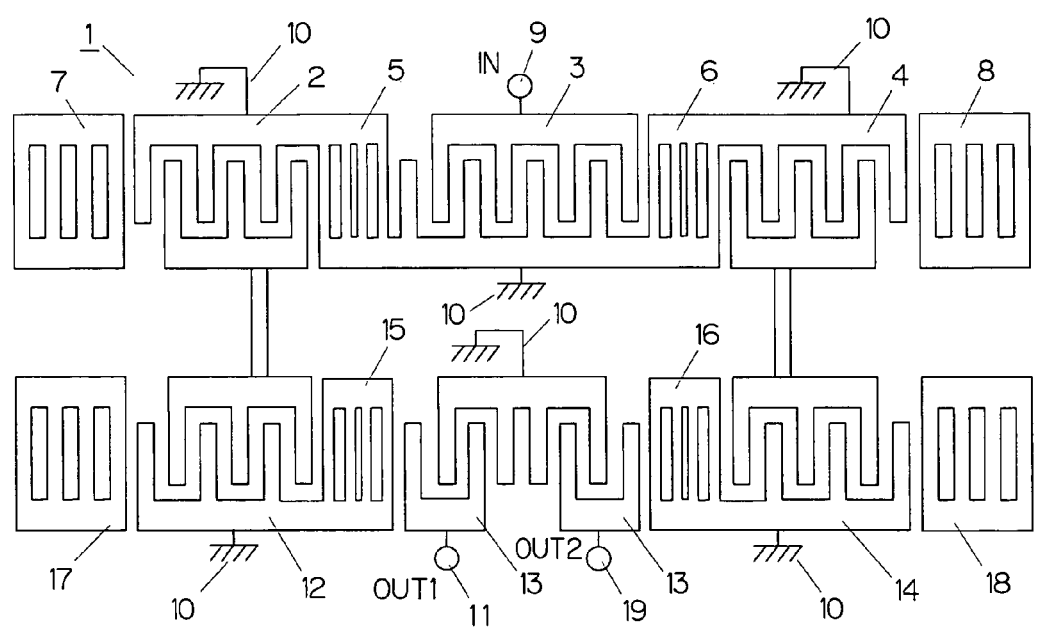
FIG. 5 is a plan view schematically showing an exemplary electrode configuration wherein reflectors and IDT electrodes are electrically interconnected whereas one of a comb electrode pair constituting the central IDT electrode 13 is divided into two parts for providing balanced input/outputs.

FIG. 5 illustrates an exemplary modification of the configuration of FIG. 4. Likewise to the SAW filter of FIG. 4, this SAW filter is configured such that in the central IDT electrode 13 of the second stage of resonator-type electrode pattern, one of the comb electrodes is divided into two parts so as to provide the balanced input/outputs.

The filter differs from the SAW filter of FIG. 4 in that the reflectors 5, 6 in the first stage of resonator-type electrode pattern have their electrode fingers connected with respectively corresponding one of the bus bars of the central IDT electrode 3 and of the IDT electrodes 2, 4 on the opposite ends of the adjoining reflectors and IDT electrodes in order to excite the electric charges symmetrically about the center of the standing wave mode. In addition, the reflectors 15, 16 in the second stage of resonator-type electrode pattern have their electrode fingers connected with respectively corresponding one of the bus bars of their individually adjoining IDT electrodes 12, 14.

Figure 6:
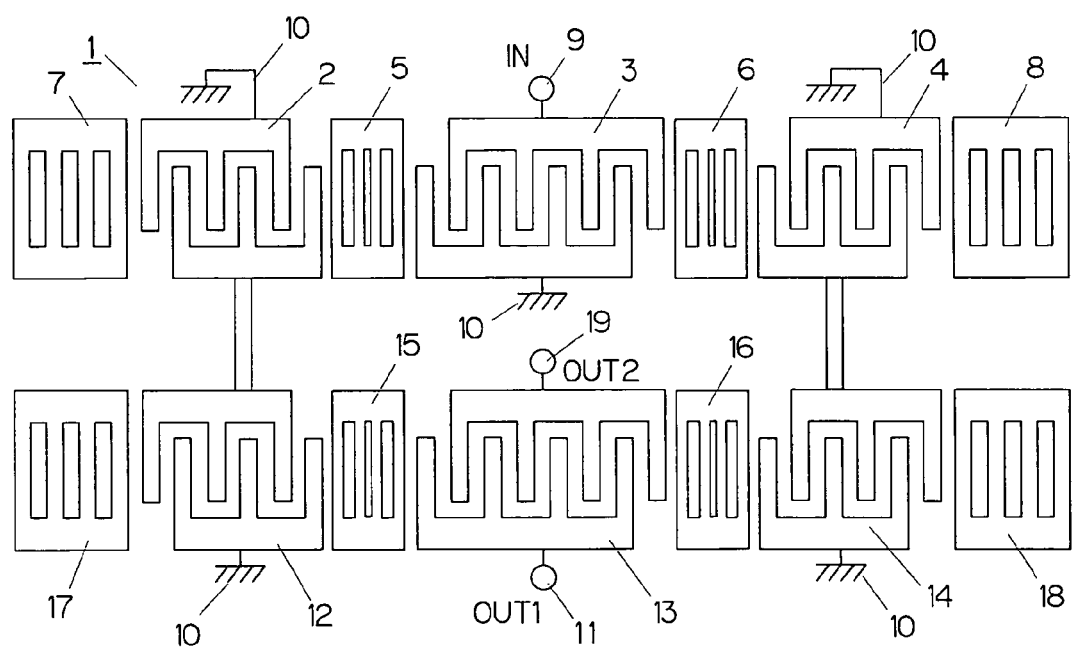
FIG. 6 is a plan view schematically showing an exemplary electrode configuration wherein each of the comb electrode pair constituting the central IDT electrode 13 defining a balanced input/output.

A SAW filter shown in FIG. 6 is essentially based on the electrode configuration of FIG. 1, but has a different electrode-finger array from that of FIG. 1 in the following points.

The central IDT electrode 3 in one of the two stages of resonator-type electrode patterns defines an unbalanced input or output portion, and is connected with an unbalanced input/output terminal 9 and with the ground terminal 10. On the other hand, the central IDT electrode 13 in the other resonator-type electrode pattern defines a balanced input or output portion, and is connected with a first balanced input/output terminal 11 and a second balanced input/output terminal 19.

Since the SAW filter shown in FIG. 6 also comprises two stages of resonator-type electrode patterns, the filter has an advantage of achieving a great amount of attenuation as the filter characteristics. By virtue of the above configuration that the plural stages of resonator-type electrode similar patterns are disposed in parallel with each other, the filter may be improved in the amplitude balance and phase balance as compared with the resonator-type SAW filter having the conventional configuration.

Figure 7:
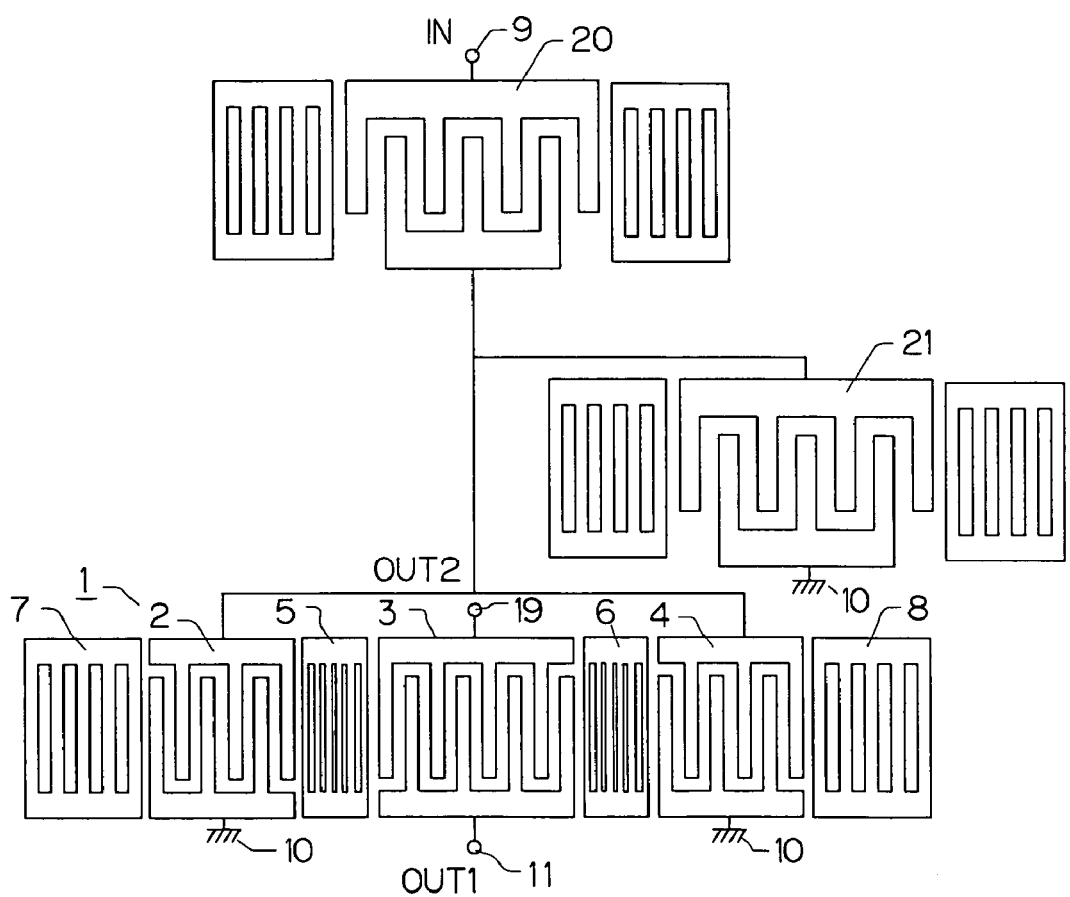
FIG. 7 is a plan view schematically showing an exemplary electrode configuration wherein a ladder-type SAW resonator 20 for mode resonance generation is added in series whereas a similar ladder-type SAW resonator 21 is added in parallel.

FIG. 7 shows a one-stage SAW filter comprising IDT electrodes and reflectors sandwiched between the IDT electrodes. The SAW filter further includes a ladder-type SAW resonator 20 added in series thereto, and a ladder-type SAW resonator 21 added in parallel thereto, the ladder-type SAW resonators generating mode resonance.

It is noted that the method of adding the ladder-type SAW resonators is not limited to the combination of the series connection and parallel connection, as shown in FIG. 7. All the resonators may be added in parallel connection or in series connection. While the above configuration illustrates the ladder-type SAW resonator comprising the ladder-type circuit added with the SAW resonator, a lattice-type SAW resonator including a lattice-type circuit may be used.

Specifically, the SAW filter of FIG. 7 is configured such that three or more IDT electrodes 2, 3, 4 are arranged on the piezoelectric substrate 1 and that the reflectors 5, 6 are interposed between the IDT electrodes 2 and 3, and the IDT electrodes 3 and 4, respectively, the reflectors each comprising an electrode including the electrode fingers extended perpendicularly to the propagation direction of the surface acoustic wave. The reflectors 5, 6 each have the electrode-finger pitch progressively decreased from the opposite ends of the finger-electrode group toward the central finger electrode.

In the above resonator-type electrode pattern, the reflectors having the variable finger pitch and interposed between the IDT electrodes provide the multiple reflection of the surface acoustic wave, thereby reducing the radiation loss into the bulk wave as well increasing the pass bandwidth as the filter characteristics. What is more, the above configuration is adapted to reduce the insertion loss, thus offering the SAW filter of high quality.

The ladder-type SAW resonators 20, 21 may be added in series and in parallel, thereby accomplishing impedance matching between an input and an output. Furthermore, the attenuation pole may be formed by connecting the SAW resonators 20, 21 and hence, the characteristics of the filter may be so controlled as to satisfy the specifications required of a great amount of out-of-band attenuation.

Figure 8:
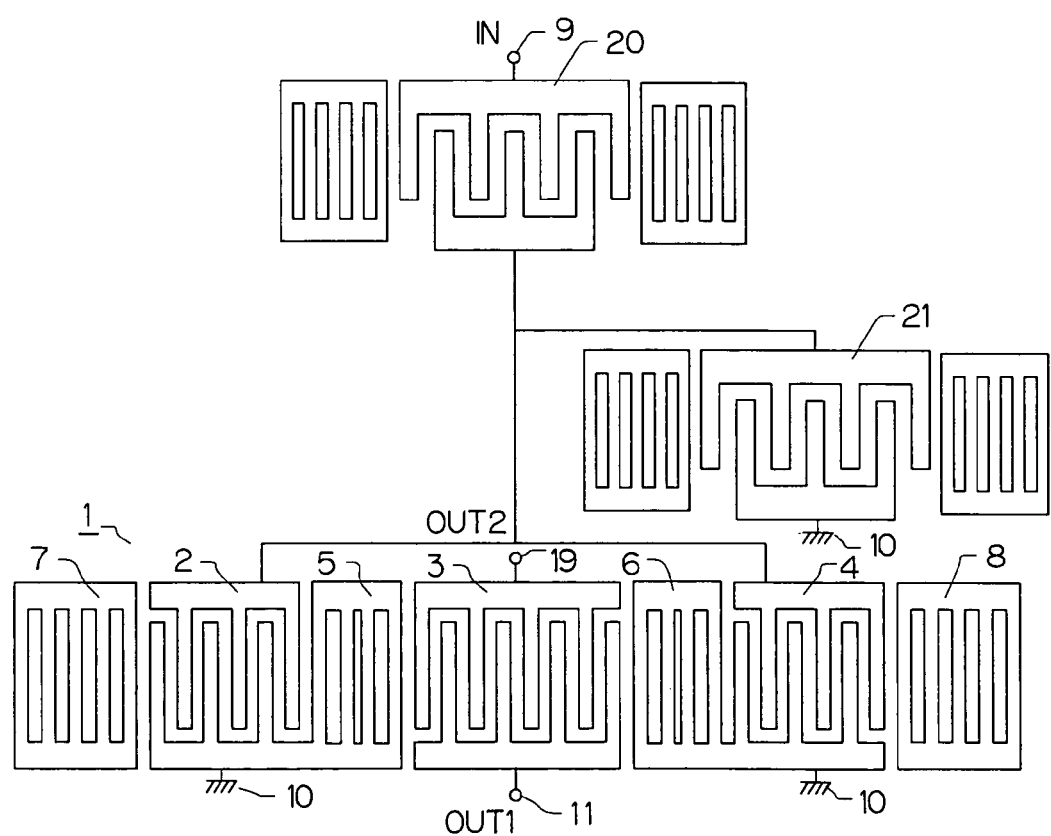
FIG. 8 is a plan view schematically showing an exemplary electrode configuration wherein the electrode fingers of a reflector is connected with its adjoining IDT electrode.

A SAW filter shown in FIG. 8 has substantially the same electrode configuration as that shown in FIG. 7. A difference from the electrode configuration of FIG. 7 consists in that the reflectors 5, 6 have their electrode fingers connected with respectively corresponding one of the bus bars of their individually adjoining IDT electrodes 2, 4.

Figure 9:
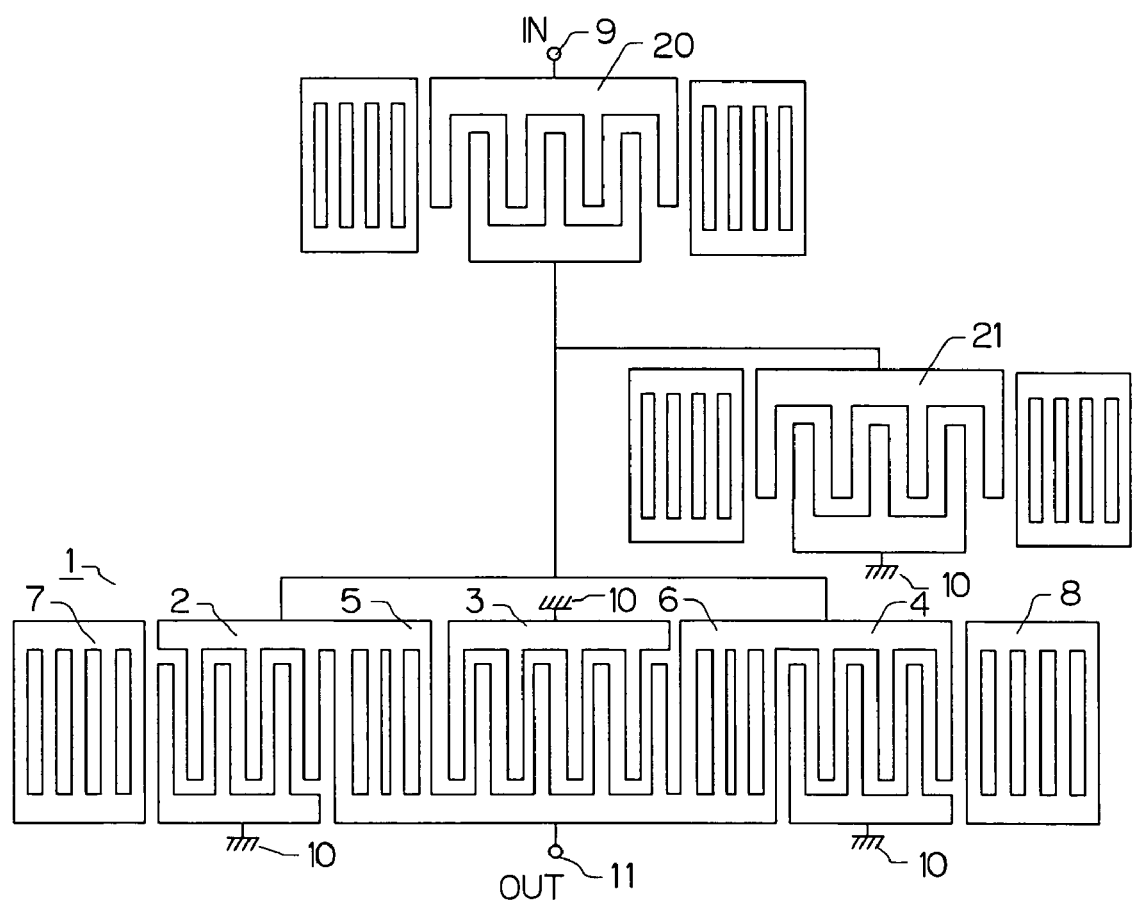
FIG. 9 is a plan view schematically showing another exemplary electrode configuration wherein the electrode fingers of the reflector are connected with its adjoining IDT electrodes.

FIG. 9 is a plan view illustrating an exemplary modification of the aforementioned configuration of FIG. 8. A difference from the configuration of FIG. 8 consists in that the reflectors 5, 6 have their electrode fingers connected with respectively corresponding one of the bus bars of their adjoining central IDT electrode 3 and of the IDT electrodes 2, 4 on the individual outer sides thereof in order to excite the electric charges symmetrically about the center of the standing wave mode.

Figure 10:
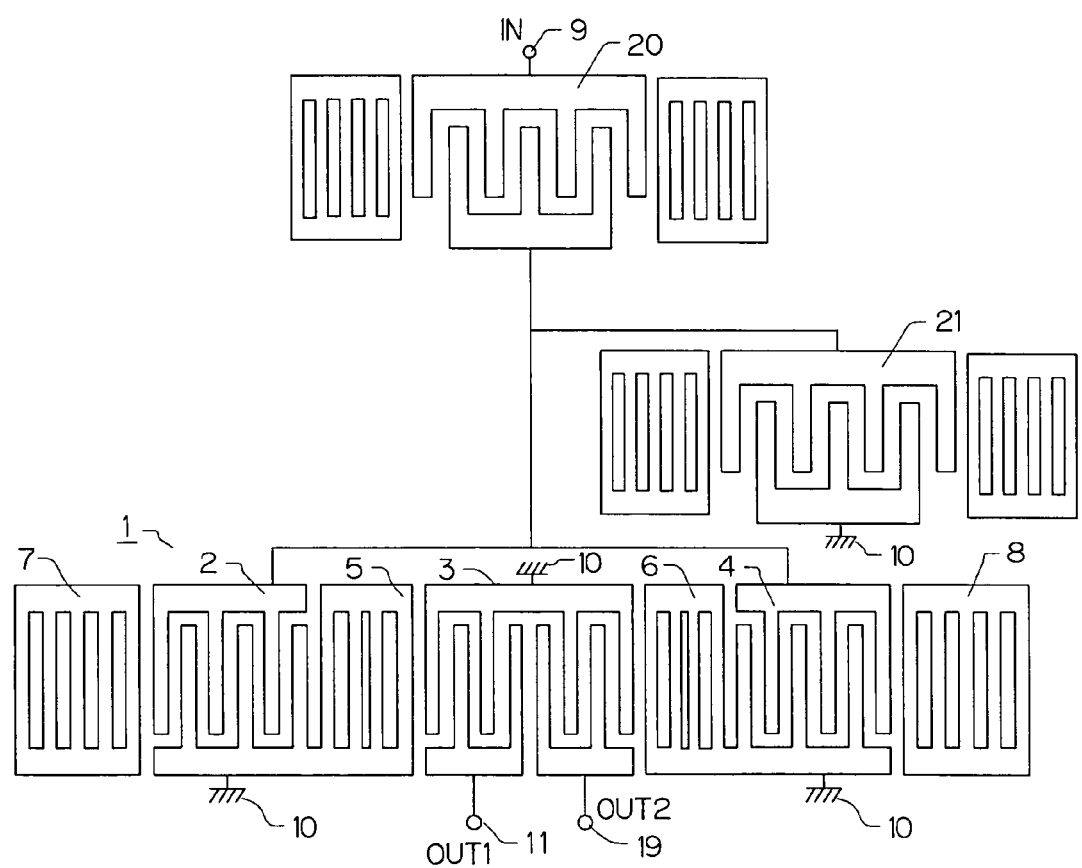
FIG. 10 is a plan view schematically showing an exemplary electrode configuration wherein one of a comb electrode pair constituting the central IDT electrode 3 is divided into two parts for providing balanced input/outputs.

Similarly to the configuration of FIG. 8, a SAW filter of FIG. 10 is configured such that the reflectors 5, 6 have their electrode fingers connected with respectively corresponding one of the bus bars of the individually adjoining IDT electrodes 2, 4 in order to excite the electric charges symmetrically about the center of the standing wave mode. In the configuration of FIG. 10, one of the comb electrodes constituting the central IDT electrode 3 of the resonator-type SAW filter is divided into two parts for providing balanced input/outputs.

Figure 11:
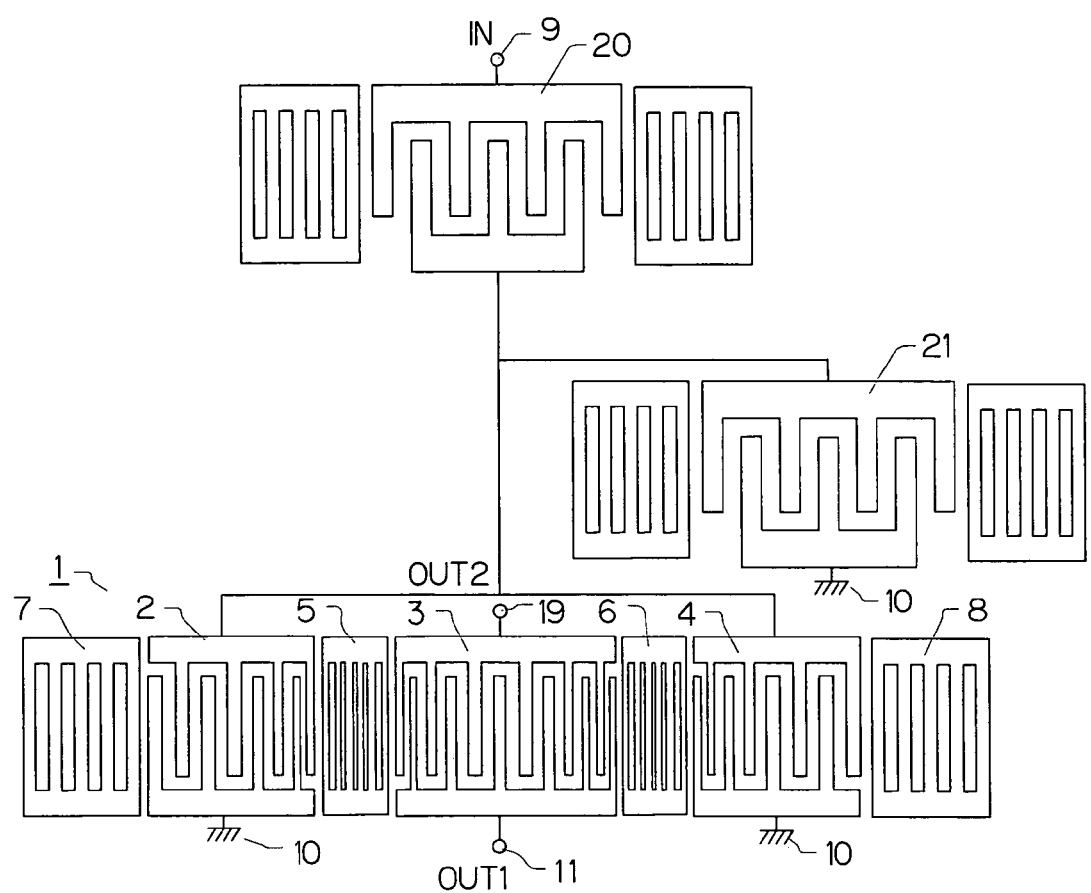
FIG. 11 is a plan view schematically showing an exemplary electrode configuration wherein the pitch of the electrode fingers in the IDT electrodes 2, 3, 4 is varied.

A SAW filter of FIG. 11 is substantially configured the same way as the SAW filter shown in FIG. 7 but is further characterized by the following arrangement.

Specifically, the filter includes one or more stages of plural IDT electrodes (IDT electrodes 2, 3, 4) arranged on the piezoelectric substrate 1 along the propagation direction of the surface acoustic wave propagated on the piezoelectric substrate 1, the IDT electrode including plural electrode fingers extended perpendicularly to the propagation direction. In addition, the reflectors 5, 6 are interposed between the IDT electrodes 2 and 3 and between the IDT electrodes 3 and 4, the reflector including the plural electrode fingers extended perpendicularly to the propagation direction of the surface acoustic wave. Reference numerals 7, 8 in the figure represent reflectors disposed on the individual outer sides of the IDT electrodes. A reference numeral 9 represents an input signal terminal; a reference numeral 10 represents a ground terminal; and reference numerals 11, 19 represent output signal terminals.

In a region of the IDT electrode 2 between the opposite ends thereof, the electrode-finger pitch is progressively decreased from the end thereof farther away from the reflector 5 toward the end thereof close to the reflector 5. In a region of the IDT electrode 4 between the opposite ends thereof, the electrode-finger pitch is progressively decreased from the end thereof farther away from the reflector 6 toward the end thereof close to the reflector 6. In respective regions between the center and the individual opposite ends of the IDT electrode 3 sandwiched between the reflectors 5, 6, the electrode-finger pitch is progressively decreased from the center thereof toward the ends thereof individually adjoining the reflectors 5, 6.

Furthermore, the filter is characterized in that the maximum value of the electrode-finger pitch of the aforesaid reflector is smaller than an average value of the electrode-finger pitch of the adjacent IDT electrode.

Such a configuration is adapted for more effective reduction of the radiation loss into the bulk wave, thereby achieving a broadened pass bandwidth. Thus, the filter may be improved in the insertion loss.

Figure 12:
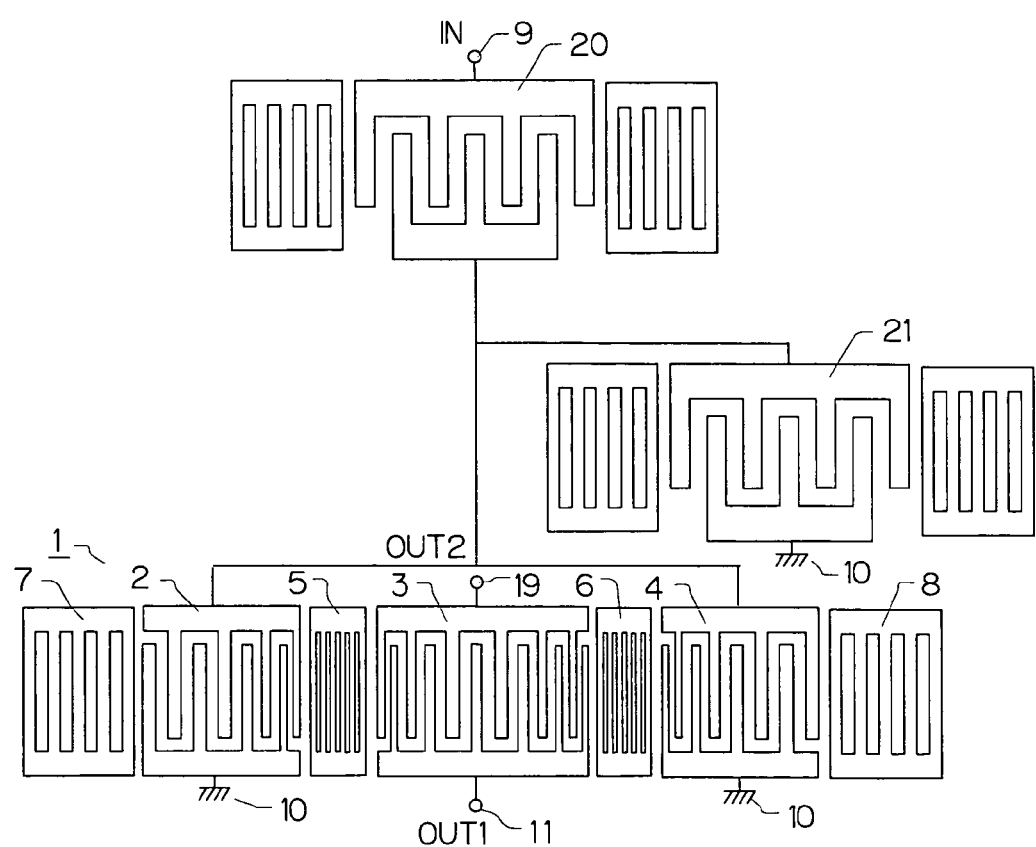
FIG. 12 is a plan view schematically showing another exemplary electrode configuration wherein the pitch of the electrode fingers in the IDT electrodes 2, 3, 4 is varied.

A SAW filter shown in FIG. 12 is substantially configured the same way as that of FIG. 11, but differs therefrom in the following points. As seen in FIG. 12, the reflectors 5, 6 are interposed between the IDT electrodes 2 and 3 and between the IDT electrodes 3 and 4, the reflectors each including the plural electrode fingers extended perpendicularly to the propagation direction of the surface acoustic wave. Furthermore, the electrode-finger pitch of the reflectors 5, 6 is smaller than the average value of the electrode-finger pitch of the respective adjacent IDT electrodes and is of an unvaried or constant value.

Figure 13:
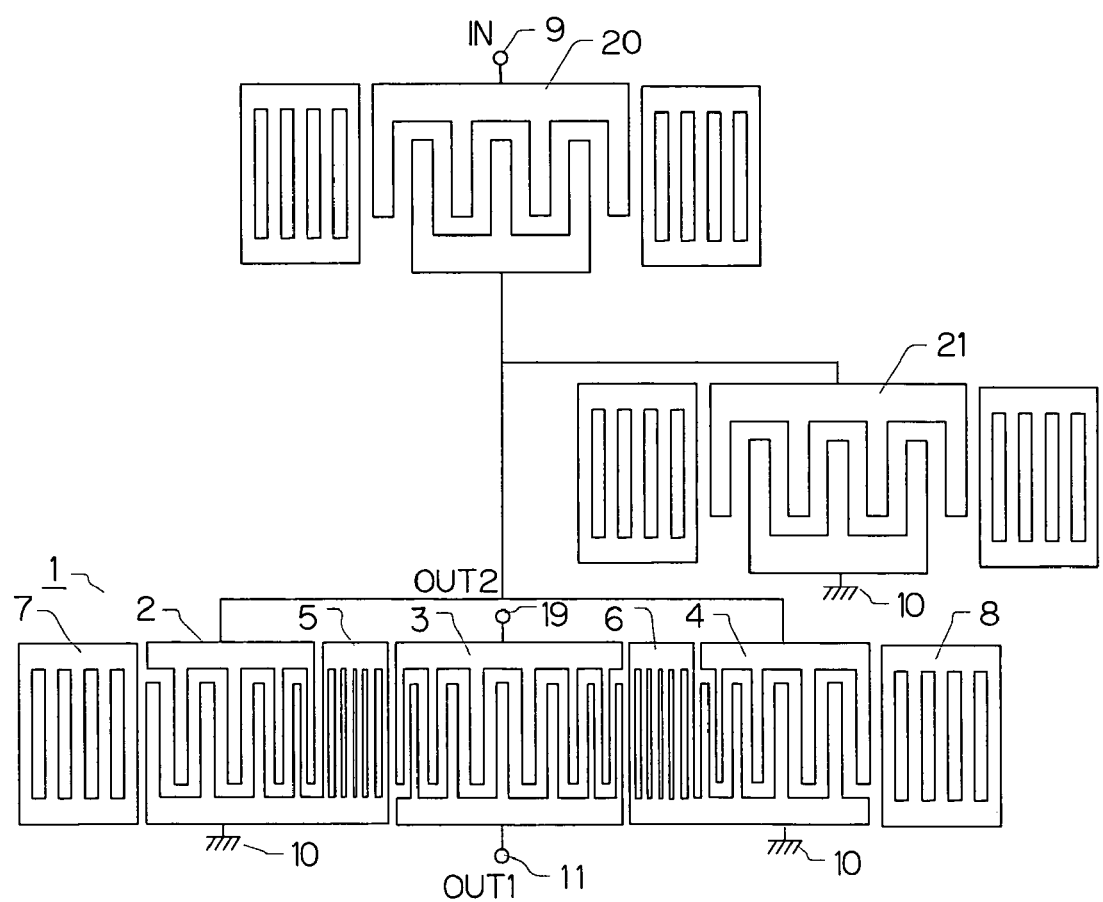
FIG. 13 is a plan view schematically showing an exemplary electrode configuration wherein the pitch of the electrode fingers in the IDT electrodes 2, 3, 4 is varied, and the electrode fingers of the reflector is connected with its adjoining IDT electrode.

A SAW filter shown in FIG. 13 is basically configured the same way as that of FIG. 11 but differs therefrom in that the reflectors 5, 6 have their electrode fingers connected with respectively corresponding one of the bus bars of the IDT electrodes 2, 4 on the individual outer sides thereof in order to excite the electric charges symmetrically about the center of the standing wave mode.

Figure 14:
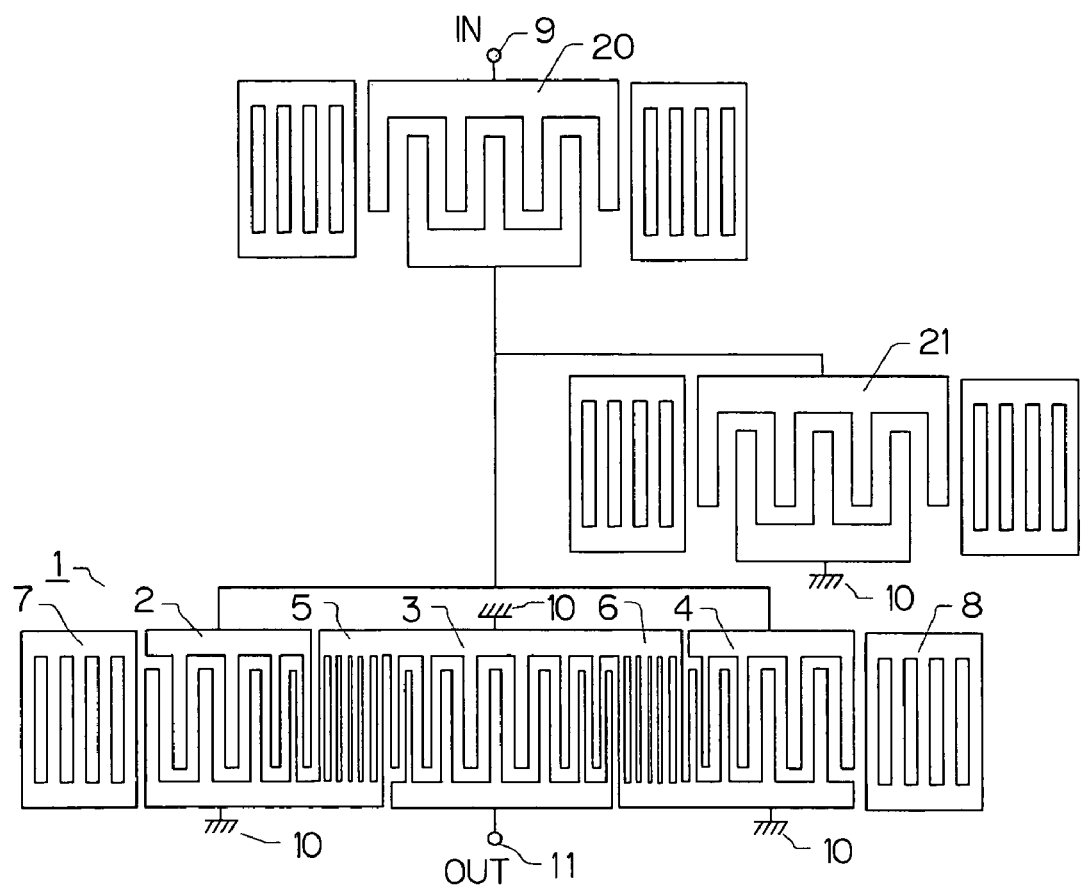
FIG. 14 is a plan view schematically showing an exemplary electrode configuration wherein the reflectors 5 and 6 are connected with the central IDT electrode 3 in adjoining relation therewith and with the IDT electrodes 2, 4 on the individual outer sides thereof.

A SAW filter shown in FIG. 14 is basically configured the same way as that of FIG. 11 but differs therefrom in that the reflectors 5, 6 have their electrode fingers connected with respectively corresponding one of the bus bars of the central IDT electrode 3 adjacent thereto and with respectively corresponding one of the bus bars of the IDT electrodes 2, 4 on the individual outer sides thereof.

Figure 15:
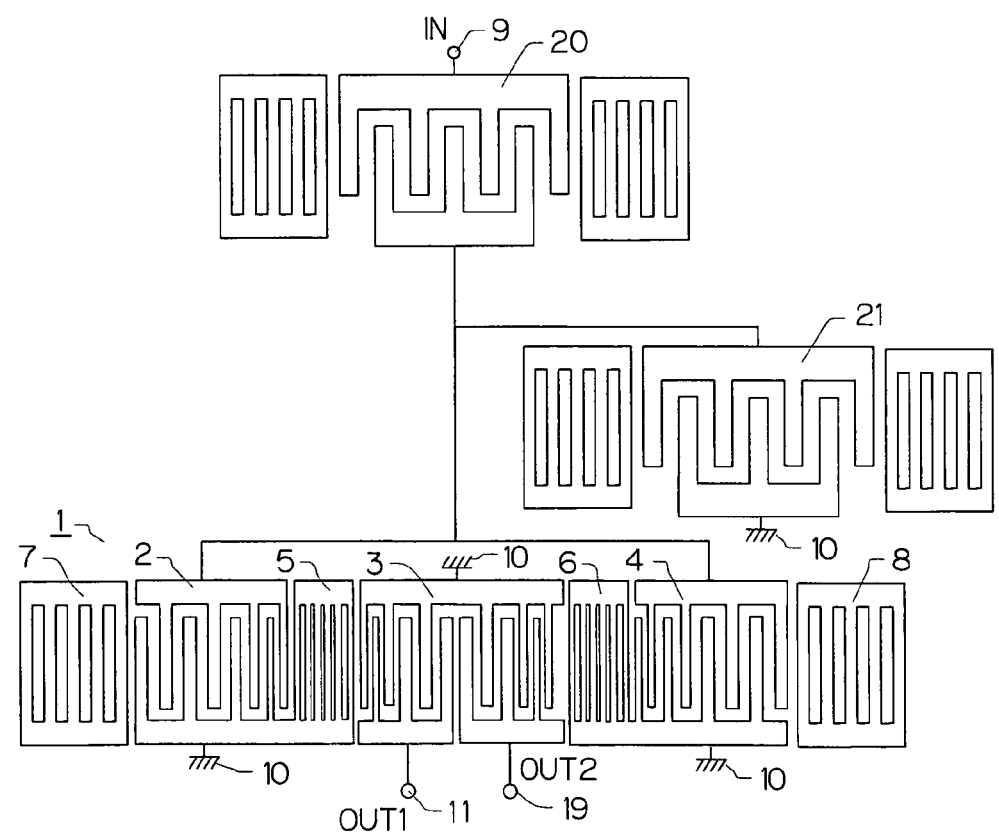
FIG. 15 is a plan view schematically showing an exemplary electrode configuration wherein one of the comb electrode pair constituting the central IDT electrode 3 is divided into two parts for providing balanced input/outputs.

Similarly to the SAW filter shown in FIG. 10, a SAW filter shown in FIG. 15 is configured such that one of the comb electrodes constituting the central IDT electrode 3 is divided into two parts for providing balanced input/outputs. However, the filter differs from the filter of FIG. 10 in that the reflectors 5, 6 have their electrode fingers connected with respectively corresponding one of the bus bars of the outer IDT electrodes 2, 4 adjacent thereto.

Figure 16:
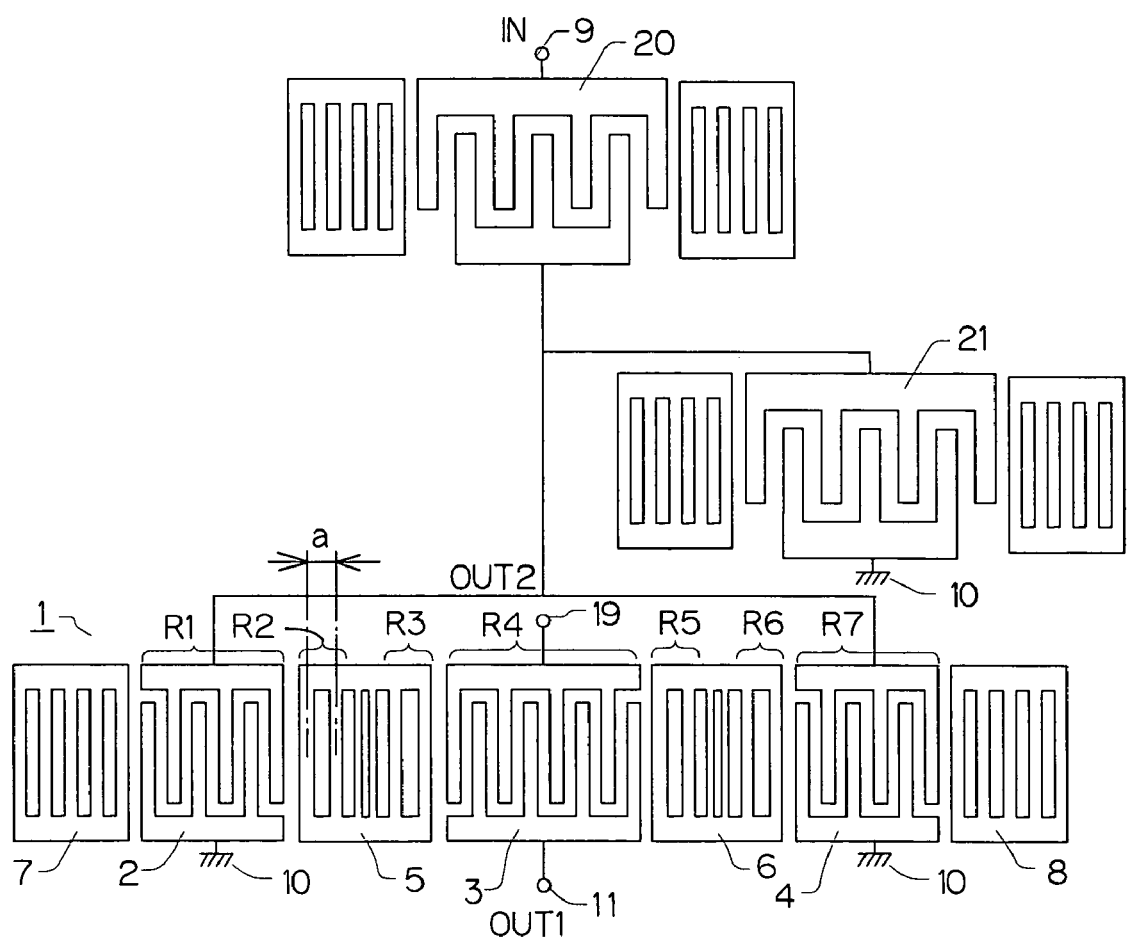
FIG. 16 is a plan view schematically showing an exemplary electrode configuration wherein the electrode-finger pitch of the reflector is progressively decreased from the electrode fingers at the opposite ends thereof toward a central electrode finger thereof.

Similarly to the SAW filter shown in FIG. 7, a SAW filter of FIG. 16 is configured such that three or more IDT electrodes 2, 3, 4 are arranged on the piezoelectric substrate 1 and that the reflectors 5, 6 are interposed between the IDT electrodes 2 and 3 and between the IDT electrodes 3 and 4, the reflectors including the electrode fingers extended perpendicularly to the propagation direction of the surface acoustic wave. However, this filter differs from the filter of FIG. 7 in the following points.

This filter is characterized in that in individual regions R2, R3 of the reflector 5 and individual regions R5, R6 of the reflector 6, the maximum value 'a' of the electrode-finger pitch is smaller than the average electrode-finger pitch of the IDT electrodes 2, 3, 4. This contributes to the further reduction of the insertion loss and hence, the filter can achieve an even broader pass bandwidth.

Figure 17:
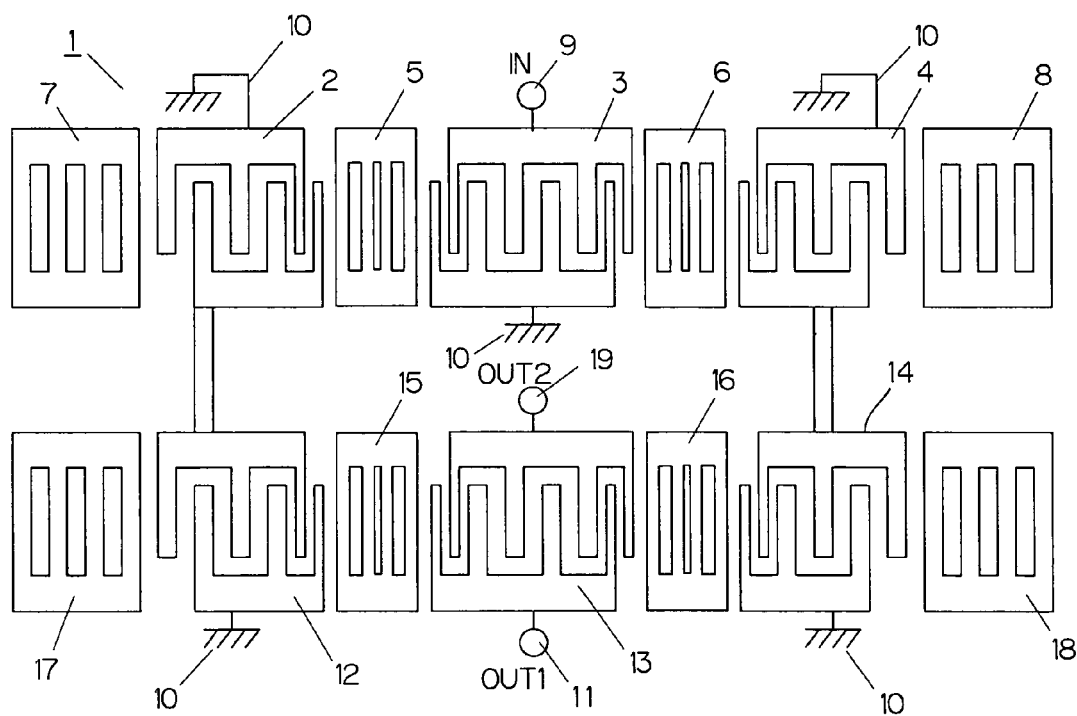
FIG. 17 is a plan view schematically showing an exemplary electrode configuration wherein the electrode-finger pitch of the IDT electrode is progressively decreased toward the reflector.

Similarly to the SAW filter of FIG. 11, a SAW filter shown in FIG. 17 is configured such that three IDT electrodes are juxtaposed along the propagation direction of the surface acoustic wave, that the reflectors are disposed in a manner to sandwich these IDT electrodes between there, and that the electrode-finger pitch of each of the IDT electrodes is progressively decreased toward each of the reflectors.

The configuration differs from that of FIG. 11 in that two stages of resonator-type electrode patterns are interconnected. This configuration is advantageous in that a filter characteristic of high attenuation is attained. Furthermore, because of the above two-stage configuration of the resonator-type electrode similar patterns in parallel to each other, the filter is more improved in both the amplitude balance and the phase balance as compared with the resonator-type SAW filter of the conventional configuration.

Figure 18B:
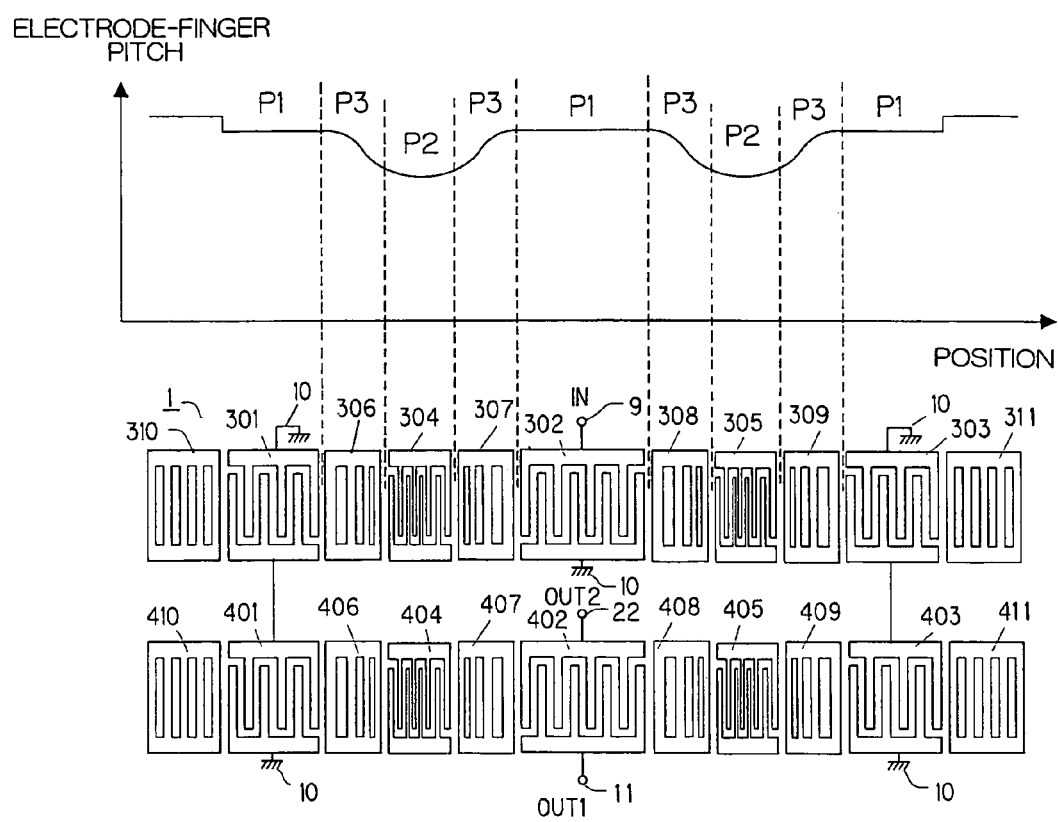
FIG. 18B is a plan view showing a resonator-type electrode pattern configuration wherein a modification is made to the configuration of FIG. 18A such that an electrode-finger pitch of reflectors 306, 307, 308, 309, 406, 407, 408, 409 is varied.
Figure 18C:
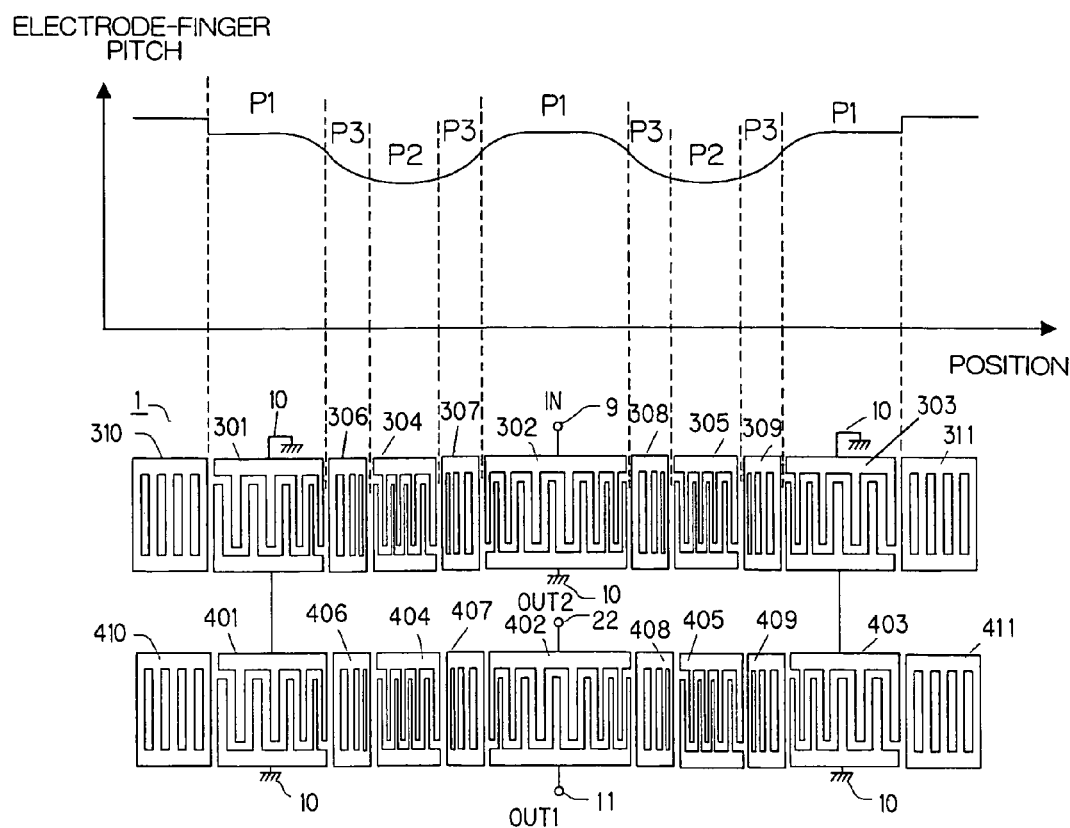
FIG. 18C is a plan view showing a resonator-type electrode pattern configuration wherein a modification is made to the configuration of FIG. 18B such that an electrode-finger pitch of reflectors 301, 302, 303, 401, 402, 403 is varied.

FIGS. 18A to 18C are plan views each showing a resonator-type electrode pattern laid out on the piezoelectric substrate 1 along the propagation direction of the surface acoustic wave. While the resonator-type electrode patterns are formed in two stages, description is made on only the configuration of the upper stage because both of the stages are of the same pattern.

First, the resonator-type electrode pattern of FIG. 18A is described. The above resonator-type electrode pattern includes five IDT electrodes 301 to 305 each including electrode fingers extended perpendicularly to the propagation direction of the surface acoustic wave; and four reflectors 306 to 309 individually interposed between a respective pair of IDT electrodes closely spaced from each other along the aforesaid propagation direction of the surface acoustic wave. Furthermore, reflectors 310, 311 are individually disposed on an outer side of each of the outermost IDT electrodes. In addition, the figure also shows the input terminal 9, the ground terminal 10, and the output terminals 11, 22.

Out of the five IDT electrodes 301 to 305, the centrally located IDT electrode 302 and the outermost IDT electrodes 301, 303 have an equal electrode-finger pitch, which is expressed as P1.

An electrode-finger pitch of the IDT electrodes 304, 305 interposed in respective spaces between the IDT electrodes 301, 302, 303 is expressed as P2. The electrode-finger pitch P2 is defined to be smaller than the electrode-finger pitch P1. That is, P2<P1.

According to the configuration of FIG. 18A, the electrode-finger pitch P2 is progressively decreased in each region from each of the opposite ends of the IDT electrode 304, 305 to the center thereof.

Such a relation between the electrode-pitches P1, P2 is graphically represented in FIG. 18A.

By defining the relation of the electrode-finger pitches of the IDT electrodes in this manner, the resonator-type electrode pattern is adapted for fine adjustment of frequencies between the first-order mode and a higher harmonic mode thereof, and between the third-order mode and a higher harmonic mode thereof. Furthermore, there may be provided a filter featuring broader bandwidth, lower loss and high transmission performance.

FIG. 18B shows a configuration of a resonator-type electrode pattern wherein the above reflectors 306, 307, 308, 309 have a variable electrode-finger pitch.

The electrode-finger pitch of the above reflectors 306, 307, 308, 309 is expressed as P3. According to the configuration, the electrode-finger pitch P3 is smaller than the electrode-finger pitch P1 of the central IDT electrode 302 and the outermost IDT electrodes 301, 303, but is greater than the electrode-finger pitch P2 of the IDT electrodes 304, 305 interposed between the above IDT electrodes. That is, the configuration is designed to satisfy the relation P2<P3<P1.

Furthermore, the electrode-finger pitch P3 of the reflectors 306, 307 is progressively decreased from place away from the IDT electrode 304 toward the IDT electrode 304. The electrode-finger pitch P3 of the reflectors 308, 309 is progressively decreased from place away from the IDT electrode 305 toward the IDT electrode 305.

FIG. 18B graphically represents such a relation among the electrode-finger pitches P1, P2, P3. In contrast to the graph of FIG. 18A, the electrode-finger pitch P3 of the reflectors 306, 307, 308, 309 is progressively decreased toward the IDT electrodes 304, 305.

A filter having a good transmission performance featured by an even broader bandwidth and an even lower loss than the filter of FIG. 18A may be provided by defining the relation between the electrode-finger pitches of the IDT electrodes and the reflectors in this manner.

FIG. 18C is a plan view showing a resonator-type electrode pattern wherein the IDT electrodes 301, 302, 303 have a variable electrode-finger pitch P1.

According to the resonator-type electrode pattern, the electrode-finger pitch P1 of the IDT electrodes 301, 303 is progressively decreased toward the reflectors 306, 309. On the other hand, the electrode-finger pitch P1 of the IDT electrode 302 is progressively decreased from the center thereof toward the reflectors 307, 308.

FIG. 18C graphically represents such a relation among the electrode-finger pitches P1, P2, P3. While the graph of FIG. 18B shows the electrode-finger pitch P1 of the IDT electrodes 301, 302, 303 as the constant value, FIG. 18C shows the electrode-finger pitch P1 of the IDT electrodes 301, 302, 303 progressively decreased toward the reflectors 306, 307, 308, 309.

A filter having a good transmission performance featured by an even broader bandwidth and an even lower insertion loss than the filters of FIGS. 18A and 18B may be provided by defining the relation between the electrode-finger pitches of the IDT electrodes and the reflectors in this manner.

It is to be noted that the electrode configurations of the SAW filters of FIGS. 1 to 18C, as described in the foregoing, are not limited to the illustrated embodiments. The invention is not limited to the two-stage configuration but may include more than two stages so long as at least three IDT electrodes adjoin two reflectors and the central IDT electrode of these three IDT electrodes defines an unbalanced input or output portion whereas the IDT electrodes on the opposite sides thereof define balanced output or input portions.

Next, a brief description is made on a fabrication method for the foregoing SAW filters of FIGS. 1 to 18C.

The piezoelectric substrate 1 for the SAW filter may comprise, for example, 36°±3° Y-cut, X-propagation lithium tantalate monocrystal, 42°±3° Y-cut, X-propagation lithium tantalate monocrystal, 64°±3° Y-cut, X-propagation lithium niobate monocrystal, 41°±3° Y-cut, X-propagation lithium monocrystal, or 45°±3° X-cut, Z-propagation lithium tetraborate monocrystal. These substances are preferred as the material for the piezoelectric substrate because they have high electromechanical coupling coefficients but low frequency-temperature coefficients. Out of substrates of these pyroelectrical piezoelectric monocrystals, a substrate subjected to oxygen reduction process and a substrate significantly reduced in pyroelectricity by forming solid solution with Fe or the like are preferred from the standpoint of the reliability of the device. The piezoelectric substrate may preferably have a thickness of 0.1 mm to 0.5 mm. A substrate having a thickness of less than 0.1 mm is fragile. A substrate having a thickness of more than 0.5 mm is not feasible because of an excessively high material cost and an excessively large part size.

The IDT electrodes 2, 3, 4, 12, 13, 14 and the reflectors 5, 6, 7, 8, 15, 16, 17, 18 are formed from Al or an Al alloy (Al—Cu base, Al—Ti base) by a film forming process such as vapor deposition, sputtering and CVD process. An electrode thickness may preferably be in the range of 0.1 μm to 0.5 μm from the standpoint of attaining the characteristics as the SAW filter.

In addition, Si, $SiO_2$, SiNx or $Al_2O_3$ may be deposited as a protective film over the electrodes and surface-acoustic-wave propagation portions on the piezoelectric substrate of the SAW filter of the invention for the purposes of preventing conduction by conductive foreign substances or improving power resistance.

The SAW filter of the invention is applicable to communication apparatuses. Specifically, in a communication apparatus including at least one of a receiver circuit and a transmitter circuit or including both the receiver circuit and the transmitter circuit, the SAW filter of the invention may be used as a bandpass filter included in such a circuit.

The aforesaid communication apparatus includes, for example: (1) a communication apparatus including a transmitter circuit wherein a transmission signal is mixed with a carrier frequency by a mixer, passed through a bandpass filter for attenuation of an unwanted signal and then, amplified by a power amplifier and passed through a duplexer so as to be transmitted from an antenna; and (2) a communication apparatus including a receiver circuit wherein a signal received by an antenna and passed through a duplexer is amplified by a low-noise amplifier, passed through a bandpass filter for attenuation of an unwanted signal, and then is extracted by a mixer separating the received signal from a carrier frequency. It is possible to provide excellent communication apparatuses featuring enhanced sensitivities by applying the surface acoustic wave device of the invention to the above communication apparatuses.

EXAMPLES

Example 1

The SAW filter shown in FIG. 1 was fabricated on an experimental basis. A microscopic electrode pattern of an Al(99 wt %)–Cu(1 wt %) alloy was formed over a piezoelectric substrate 1 formed from 38.7° Y-cut LiTaO$_3$ monocrystal.

The IDT electrodes 2, 12 each included 17 electrode pairs whereas the IDT electrodes 3, 4, 13, 14 each included 13 electrode pairs. All the IDT electrodes 2, 3, 4, 12, 13, 14 had an electrode-finger pitch of 2.25 μm.

The reflectors 5, 6 each included 6 electrode fingers. Similarly, the reflectors 15, 16 each included 5 electrode fingers. The reflectors 5, 6 each had electrode-finger pitches (hereinafter, referred to as "finger pitch") of 2.14 μm, 2.0 μm, 1.97 μm, 2.0 μm and 2.14 μm. That is, the finger pitch was progressively decreased toward the center of the reflector 15, 16. An average of these finger pitches was 2.05 μm.

The reflectors 7, 8, 17, 18 disposed on the individual outer sides of the IDT electrodes 2, 4, 12, 14 had a finger pitch of 2.29 μm.

The pattern was formed by a photolithographic process using a sputtering apparatus, reduction projection apparatus (stepper) and RIE (Reactive Ion Etching) apparatus.

First, a substrate material was subjected to an ultrasonic cleaning process using acetone-IPA or the like, so as to be removed of organic substances. Next, the substrate was sufficiently dried by a clean oven and then, subjected to electrode film formation. The electrode film was formed by the sputtering apparatus using an Al(99 wt %)–Cu(1 wt %) alloy. The resultant electrode film had a thickness of about 0.3 μm.

Next, a photoresist was spin coated over the substrate in a thickness of about 0.5 μm and was patterned into a desired shape by means of the reduction projection apparatus (stepper). The photoresist pattern was subjected to a developing apparatus wherein an unwanted photoresist portion was dissolved away by an alkaline developing solution thereby to obtain a desired photoresist pattern. Subsequently, the RIE apparatus was operated to etch the electrode film to complete the patterning process. Thus was obtained the electrode pattern of the SAW resonator constituting the SAW filter.

Subsequently, a protective film was overlaid on a predetermined region of the aforesaid electrode. Specifically, a SiO$_2$ film having a thickness of about 0.02 μm was overlaid on the electrode pattern and the piezoelectric substrate by means of a CVD (Chemical Vapor Deposition) apparatus. Then, the photoresist was patterned by photolithography and a window opening for electrode pad was formed by means of the RIE apparatus or the like. Thereafter, the sputtering apparatus was operated to form an electrode film based on Al. The resultant electrode film had a thickness of about 1.0 μm. Subsequently, the photoresist and an unwanted Al portion were removed at a time by a lift off process. Thus was formed an electrode pad for forming flip-chip bump.

Next, a flip-chip bump of Au was formed on the aforesaid electrode pad by means of a bump bonding apparatus. The resultant bump had a diameter of about 80 μm and a height of about 30 μm.

Next, the substrate was diced along a dicing line so as to be divided into individual chips. Then, each chip with the electrode forming face down was mounted in a package by means of a flip-chip mounting apparatus. Subsequently, the chip was baked in an N$_2$ atmosphere whereby the SAW filter was completed. The used package comprised a square laminate structure having a size of 2.5×2.0 mm.

Figure 22:
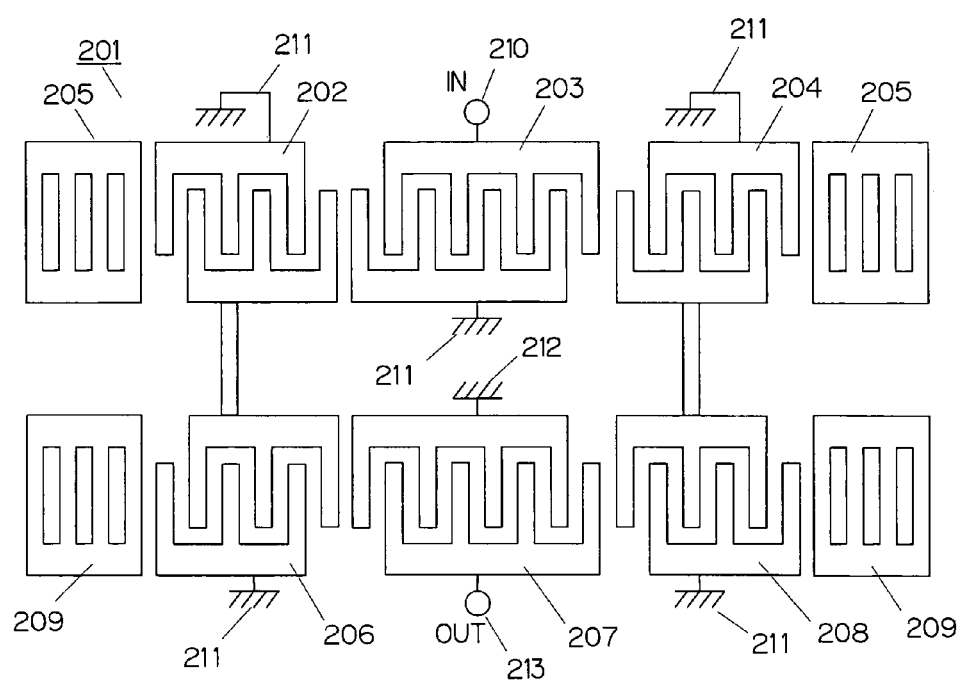
FIG. 22 is a plan view schematically showing an exemplary electrode configuration of a conventional surface acoustic wave device.
Figure 23:
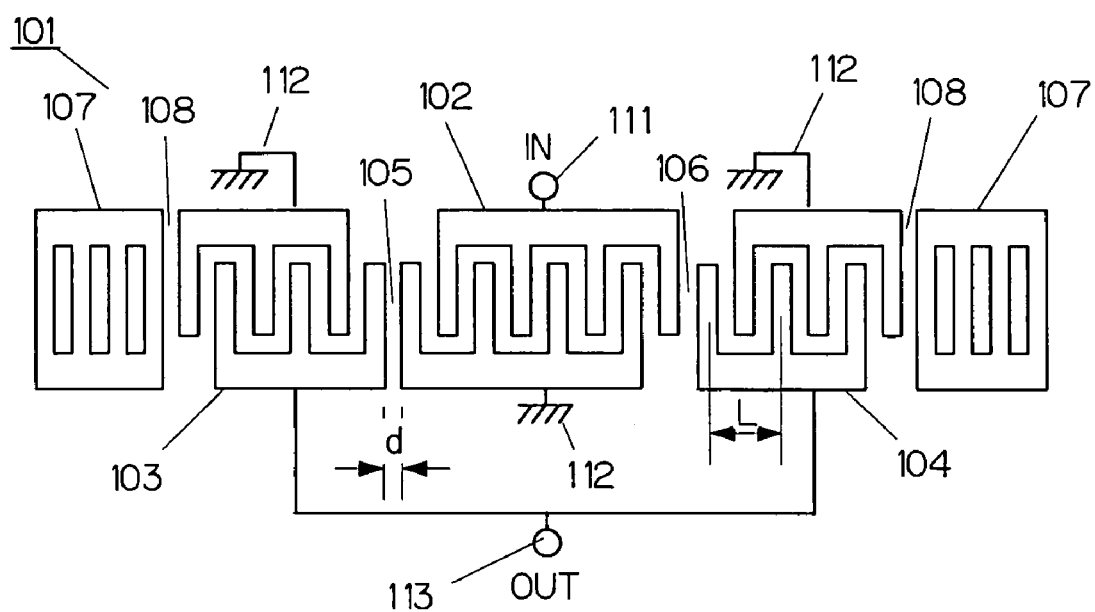
FIG. 23 is a plan view schematically showing another exemplary electrode configuration of a conventional surface acoustic wave device.

In Comparative Example 1, the same procedure as the above was taken to fabricate the microscopic electrode pattern as shown in FIG. 22. The IDT electrodes 203, 207 each included 17 electrode pairs, whereas the IDT electrodes 202, 203, 204, 206, 207, 208 each included 15 electrode pairs. All the IDT electrodes 202, 203, 204, 206, 207, 208 had a finger pitch of 2.25 μm. On the other hand, the reflectors 205, 209 disposed on the individual outer sides of the IDT electrodes had a finger pitch of 2.29 μm.

Figure 24A:
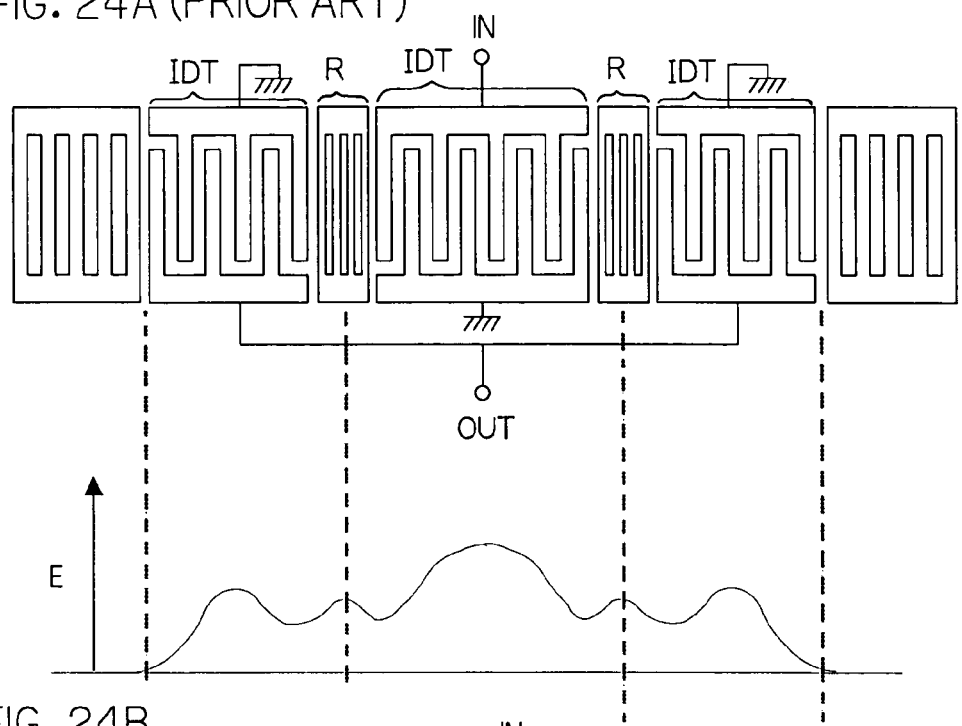
FIG. 24A is a graph representing the energy distribution of a standing wave in a conventional surface acoustic wave filter.
Figure 24B:
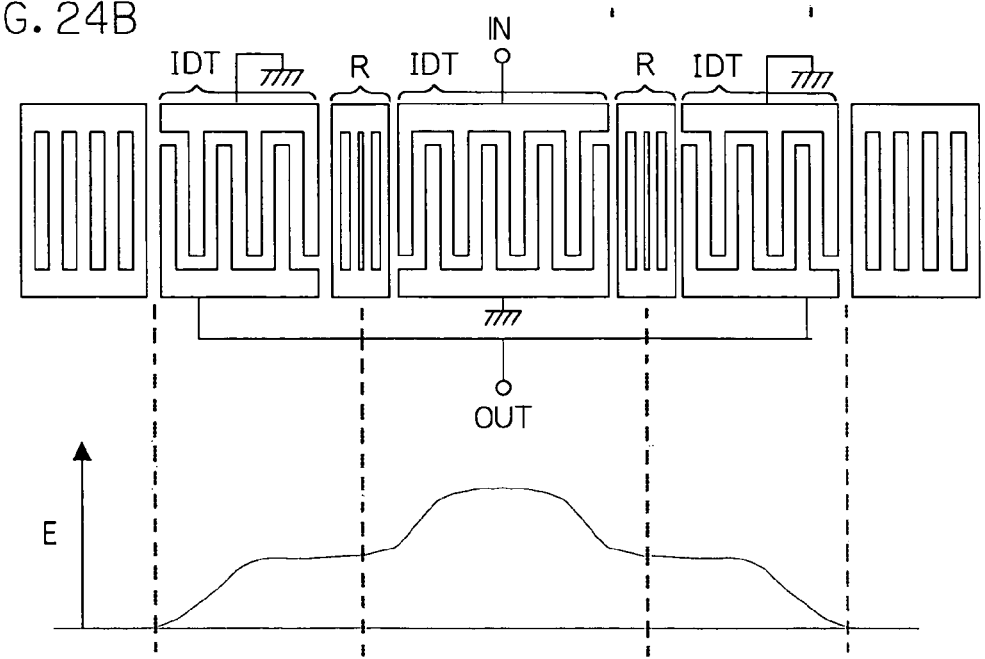
FIG. 24B is a graph representing the energy distribution of a standing wave in a surface acoustic wave filter of the invention.

In Comparative Example 2, there was also fabricated the electrode pattern as shown in FIG. 24 wherein the reflector having a constant finger pitch was interposed between the adjoining IDT electrodes.

In Comparative Example 3, there was also fabricated the electrode pattern as shown in FIG. 18A wherein the finger pitch P1 of the central IDT electrode 302 and the outermost IDT electrodes 301, 303 and the finger pitch P2 of the IDT electrodes 304, 305 interposed between the IDT electrodes 301 and 302 and between the IDT electrodes 302 and 303 had a relation P2<P1 and wherein the finger pitch P2 was progressively decreased from each of the opposite ends of the IDT electrode 304, 305 toward the center thereof.

In Comparative Example 4, there was also fabricated the electrode pattern as shown in FIG. 18B wherein the finger pitch P3 of the reflectors 306, 307, 308, 309 was smaller than the finger pitch P1 of the central IDT electrode 302 and the outermost IDT electrodes 301, 303 but was greater than the finger pitch P2 of the IDT electrodes 304, 305 interposed between these electrodes (P2<P3<P1), the finger pitch P3 varied smoothly.

Next, the SAW filters according to the example of the invention and the foresaid four comparative examples were tested. Measurement was taken at 800 measurement points while inputting a signal of 0 dBm at frequencies of 782 MHz to 982 MHz to the input terminal. There were prepared 30 samples for each filter. As measurement instruments, Multiport Network Analyzer E5071A commercially available from Agilent Technologies was used.

Figure 19A:
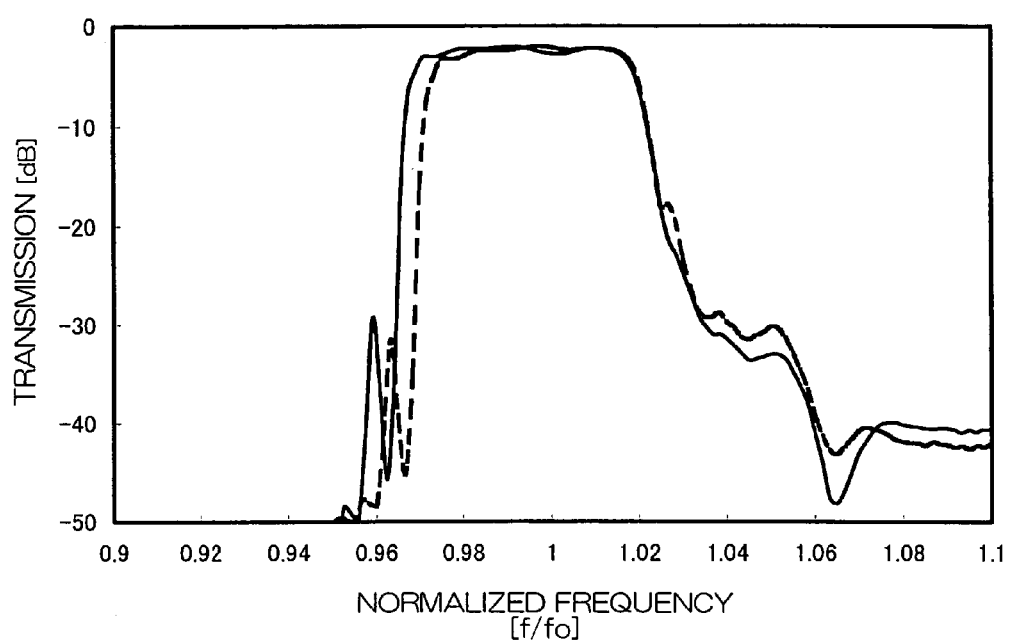
FIG. 19A is a graph representing the frequency dependence of the insertion loss of the surface acoustic wave filters according to an example of the invention and a comparative example as determined near the passband thereof.

The frequency dependence of the insertion loss of the filter according to the example of the invention is shown in FIG. 19A.

Figure 19B:
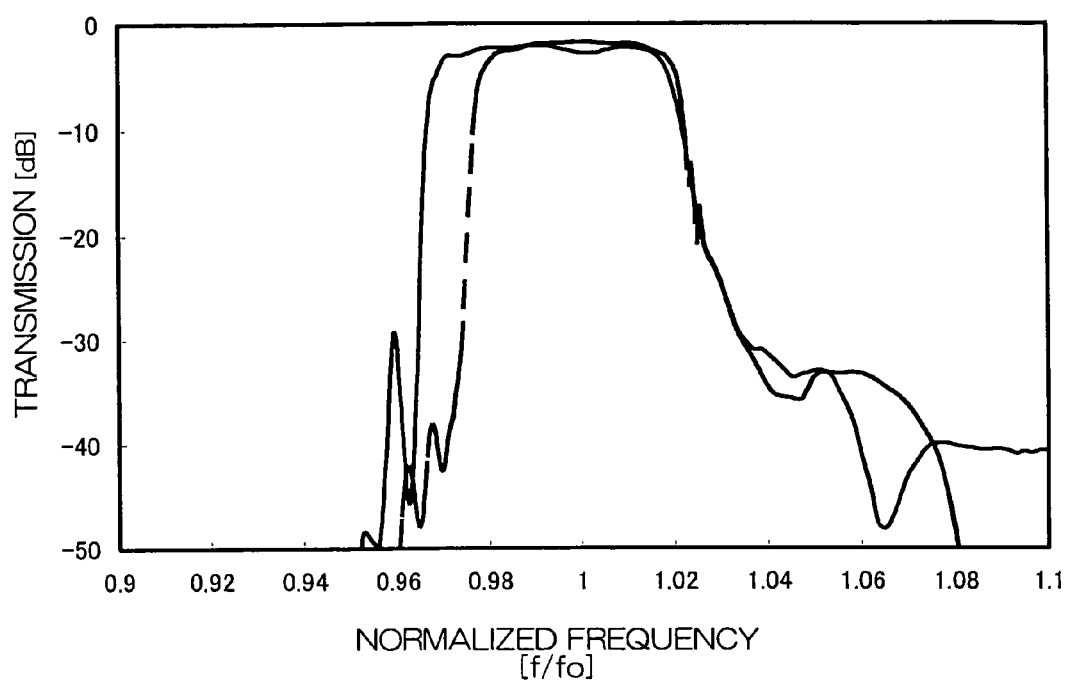
FIG. 19B is a graph representing the frequency dependence of the insertion loss of the surface acoustic wave filters according to the example of the invention and a comparative example as determined near the passband thereof, the comparative example wherein a reflector having a constant electrode-finger pitch is inserted between the IDT electrodes.

The filter characteristics of the invention are represented by the solid lines in FIGS. 19A to 19D (the solid lines in FIGS. 19A and 19B are identical). The inventive filter has a relatively broad pass bandwidth, in which a maximum insertion loss is about 2.3 dB. The inventive filter has a fractional bandwidth of 4.2% as determined by the network analyzer.

In contrast, the SAW filter of the conventional configuration including no reflector, which was fabricated as the sample of Comparative Example 1, has a narrower pass bandwidth, as indicated by the broken line in FIG. 19A, in which a maximum insertion loss is about 2.8 dB. The filter of Comparative Example 1 has a fractional bandwidth of 3.8%, as determined by the network analyzer.

On the other hand, the SAW filter of Comparative Example 2 wherein the reflector having the constant finger pitch is interposed between the IDT electrodes has an even narrower pass bandwidth, as indicated by the broken line in FIG. 19B.

Figure 19C:
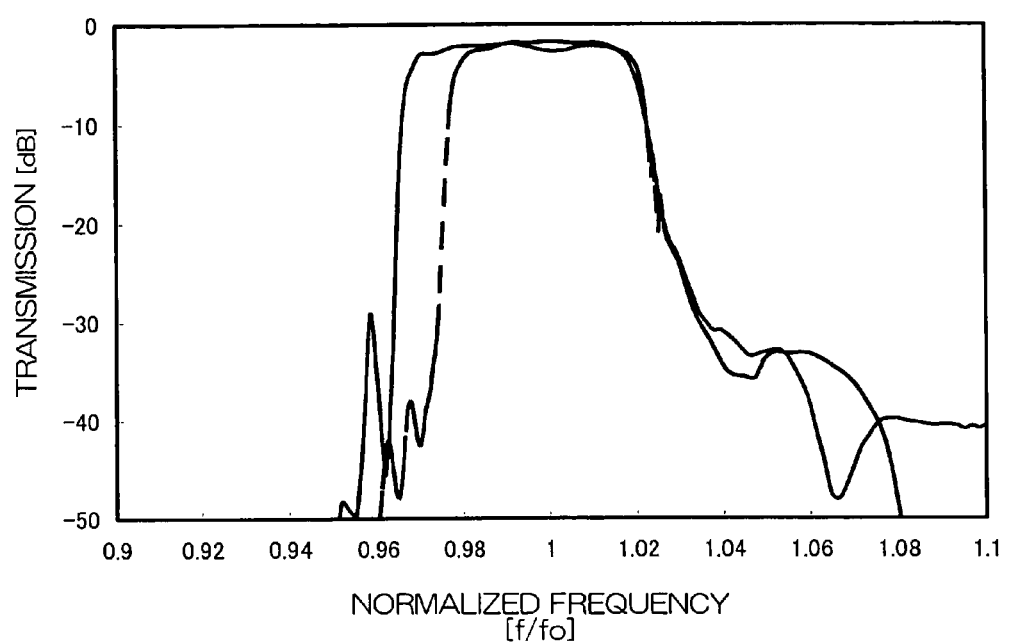
FIG. 19C is a graph representing the frequency dependence of the insertion loss of the surface acoustic wave filters according to the example of the invention and the comparative example shown in FIG. 18A as determined near the pass band thereof.

The SAW filter of Comparative Example 3 has a pass bandwidth as narrow as that of the filter of Comparative Example 2, as indicated by the broken line in FIG. 19C.

Figure 19D:
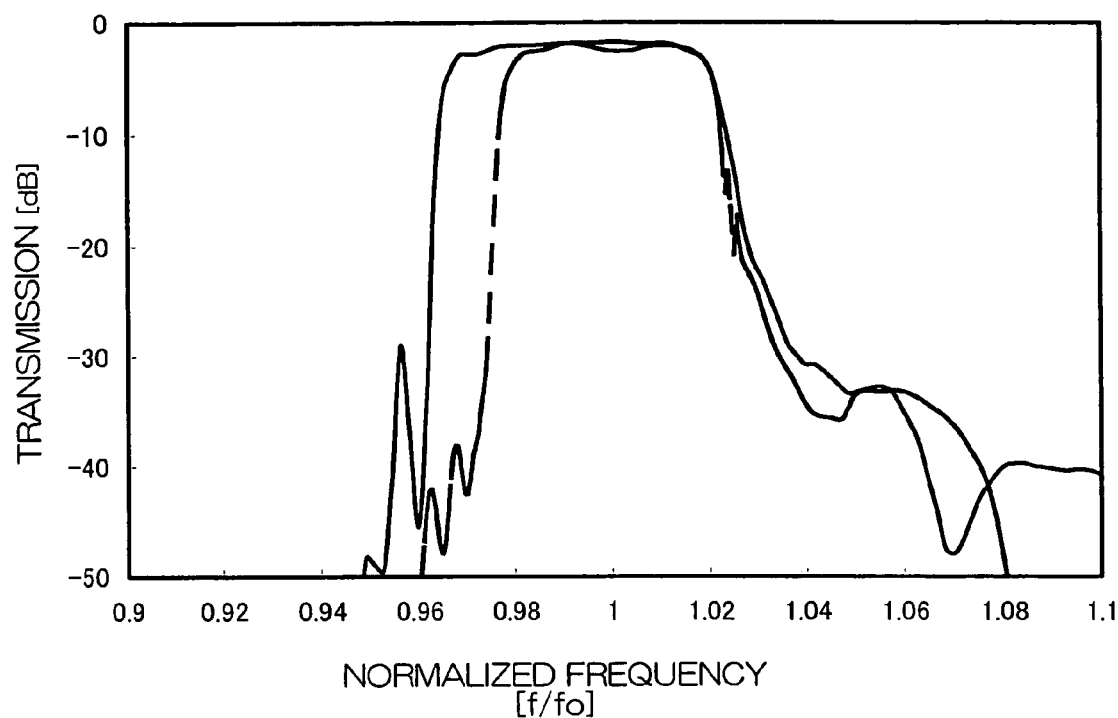
FIG. 19D is a graph representing the frequency dependence of the insertion loss of the surface acoustic wave filters according to the example of the invention and the comparative example shown in FIG. 18B as determined near the passband thereof.

The SAW filter of Comparative Example 4 has a pass bandwidth further reduced from that of the filter of Comparative Example 3, as indicated by the broken line in FIG. 19D.

Thus, Example 1 of the invention has achieved the broadened pass bandwidth and the reduced insertion loss, as the filter characteristics.

Example 2

Next, description is made on an example of the SAW filter shown in FIG. 7. As shown in FIG. 7, a microscopic electrode pattern of an Al(99 wt %)-Cu(1 wt %) alloy was formed over a piezoelectric substrate 1 formed from 38.7° Y-cut $LiTaO_3$ monocrystal.

The IDT electrode 2 included 16 electrode pairs whereas the IDT electrodes 3, 4 each included 12 electrode pairs. All the IDT electrodes 2, 3, 4 had a finger pitch of 1.0 μm. The reflectors 5, 6 each included 6 electrode fingers which were arranged with finger pitches progressively decreased from the opposite ends of the reflector toward the center thereof. That is, the reflectors 5, 6 each had the finger pitches of 0.97 μm, 0.90 μm, 0.87 μm, 0.90 μm and 0.97 μm. An average of these finger pitches was 0.922 μm. On the other hand, the reflectors 7, 8 disposed on the lateral sides of the IDT electrodes had a finger pitch of 1.02 μm.

A fabrication method of the SAW filter was substantially the same as in Example 1. A difference consists in that an electrode film had a thickness of about 0.15 μm instead of 0.3 μm.

As a sample for comparison, the microscopic electrode pattern shown in FIG. 22 was fabricated by the same procedure as in Example 1. The IDT electrodes 203, 207 each included 16 electrode pairs whereas the IDT electrodes 202, 204, 206, 208 each included 12 electrode pairs. All the IDT electrodes had a finger pitch of 1.0 μm. The reflectors 205, 209 disposed on the individual outer sides of the IDT electrodes had an average finger pitch of 1.02 μm.

Figure 20:
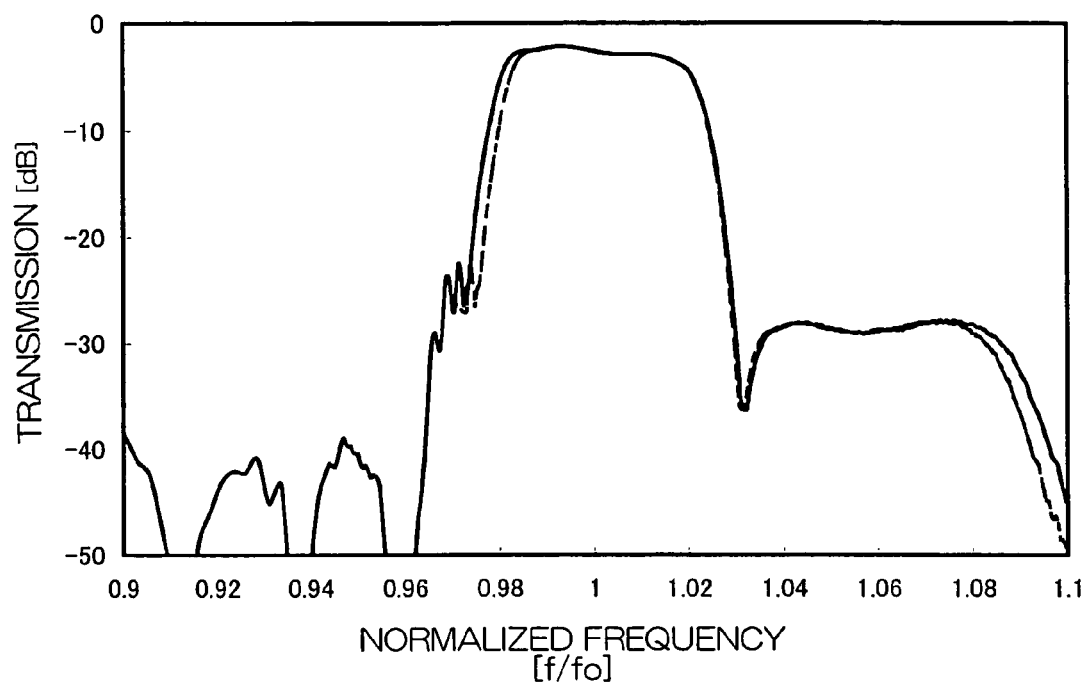
FIG. 20 is a graph representing the frequency dependence of the insertion loss of the surface acoustic wave filter shown in FIG. 7 as determined near the passband thereof.

Next, measurement was taken on the SAW filter of the example for determination of the characteristics thereof. FIG. 20 graphically represents the frequency characteristics in the vicinity of the passband of the filter. It is noted here that FIG. 20 is a graph representing the frequency dependence of the insertion loss of the filter. The measurement was taken at 800 measurement points while inputting a signal of 0 dBm at frequencies of 1760 MHz to 2160 MHz to the input terminal. There were prepared 30 samples for the filter. FIG. 20 shows one example of the transmission performance of the filter.

The filter of the invention features a broad passband as indicated by the solid line in FIG. 20. The filter has achieved a low insertion loss of about 3.0 dB in the pass bandwidth of 1930 MHz to 1990 MHz.

In contrast, the SAW filter of the conventional configuration, which was fabricated as the sample of comparative example, has a somewhat narrower pass bandwidth as indicated by the broken line in FIG. 20. The conventional filter has an insertion loss of about 3.6 dB in the pass bandwidth of 1930 MHz to 1990 MHz.

The fractional bandwidths of the example of the invention and the comparative example were determined the same way as in the foregoing example using the network analyzer. The example of the invention has a fractional bandwidth of 4.2% whereas the comparative example has a fractional bandwidth of 3.8%. Thus, Example 2 has also achieved the increased bandwidth and the reduced insertion loss.

Example 3

Next, description is made on an example of the SAW filter shown in FIG. 11. As shown in FIG. 11, a microscopic electrode pattern of an Al(99 wt %)-Cu(1 wt %) alloy was formed over a piezoelectric substrate 1 formed from 38.7° Y-cut $LiTaO_3$ monocrystal. The IDT electrode 3 included 16 electrode pairs whereas the IDT electrodes 2, 4 each included 12 electrode pairs. All the IDT electrodes 2, 3, 4 and the reflectors 5, 6 had the progressively varied finger pitches. The finger pitch of the IDT electrode 2 was progressively decreased from the center thereof toward the reflector 5, like 1.02, 1.01, 0.99 μm. The finger pitch of the IDT electrode 3 was also progressively decreased from the center thereof toward the reflector 5, like 1.02, 1.01, 0.99 μm. A finger pitches between the IDT electrodes 2, 3 and the reflector 5 were both 0.97 μm. Further, the finger pitches of the IDT electrodes 3, 4 were progressively decreased from the center thereof toward the reflector 6, like 1.02, 1.01, 0.99 μm. The finger pitches between the IDT electrodes 3, 4 and the reflector 6 were both 0.97 μm. The finger pitch of the reflector 6 was 0.90 μm in the opposite ends, and was 0.87 μm in the center thereof.

A fabrication method of the SAW filter was the same as in Example 2 and therefore, the description thereof is dispensed with.

As a comparative sample, the filter used in Example 2 was used as it was.

Next, measurement was taken on the SAW filter of the example for determination of the characteristics thereof. The measurement was taken at 800 measurement points while inputting a signal of 0 dBm at frequencies of 782 MHz to 982 MHz to the input terminal. There were prepared 30 samples for the filter.

Figure 21:
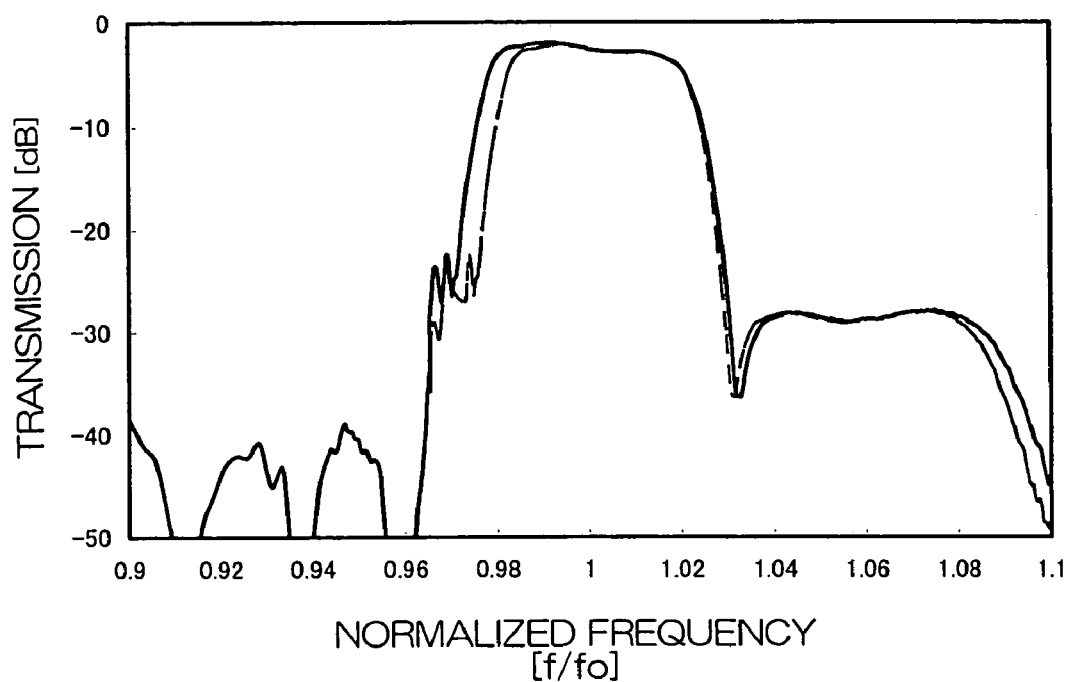
FIG. 21 is a graph representing the frequency dependence of the insertion loss of the surface acoustic wave filter shown in FIG. 11 as determined near the passband thereof.

FIG. 21 graphically represents the frequency characteristics in the vicinity of the passband of the filter. It is noted here that FIG. 21 is a graph representing the frequency dependence of the insertion loss of the filter.

As indicated by the solid line in FIG. 21, the inventive filter has the characteristics that an insertion loss in the pass bandwidth of 1930 MHz to 1990 MHz is about 2.8 dB. The filter has achieved excellent performance of low loss.

In contrast, the SAW filter of the conventional configuration, which was fabricated as the comparative sample, has an insertion loss of about 3.6 dB in the pass bandwidth of 1930 MHz to 1990 MHz, as indicated by the broken line in FIG. 21.

The fractional bandwidths of the example of the invention and the comparative example were determined the same way as in the foregoing examples using the network analyzer. The example of the invention has a fractional bandwidth of 4.2% whereas the comparative example has a fractional bandwidth of 3.8%. Thus, Example 3 has also achieved the increased bandwidth and the reduced insertion loss.

The invention claimed is:

1. A surface acoustic wave device having one or more stages of resonator-type electrode patterns arranged on a piezoelectric substrate along a propagation direction of a surface acoustic wave, and input and output terminals connected to said resonator-type electrode pattern, said resonator-type electrode pattern comprising: a plurality of IDT electrodes each including electrode fingers extended perpendicularly to the propagation direction of the surface acoustic wave; and a reflector interposed between a pair of IDT electrodes spaced from each other along said propagation direction of the surface acoustic wave, said reflector including four or more electrode fingers extended perpendicularly to said propagation direction of the surface acoustic wave and arranged with an electrode-finger pitch progressively decreased from the opposite ends of the reflector toward the center thereof wherein the maximum value of the electrode-finger pitch of said reflector is smaller than an average value of an electrode-finger pitch of said pair of IDT electrodes adjoining the reflector.

2. A communication apparatus comprising at least one of or both of a receiver circuit and a transmitter circuit including the surface acoustic wave device according to claim 1.

3. A surface acoustic wave device according to claim 1, wherein said reflector and a bus bar of at least one of said pairs of IDT electrodes in adjoining relation therewith with respect to said propagation direction are electrically interconnected.

4. A surface acoustic wave device according to claim 1, wherein one or more different resonator-type electrode patterns for mode resonance generation are added in series or in parallel to said resonator-type electrode pattern.

5. A surface acoustic wave device according to claim 1, wherein at least one of said pairs of IDT electrodes adjoining said reflector has an electrode-finger pitch progressively decreased from a region away from said reflector toward said reflector.

6. A surface acoustic wave device having one or more stages of resonator-type electrode patterns arranged on a piezoelectric substrate along a propagation direction of a surface acoustic wave, and input and output terminals connected to said resonator-type electrode pattern, said resonator-type electrode pattern comprising: a plurality of IDT electrodes each including electrode fingers extended perpendicularly to the propagation direction of the surface acoustic wave; and a reflector interposed between a pair of IDT electrodes spaced from each other along said propagation direction of the surface acoustic wave, said reflector including four or more electrode fingers extended perpendicularly to said propagation direction of the surface acoustic wave and arranged with an electrode-finger pitch progressively decreased from the opposite ends of the reflector toward the center thereof, wherein at least one of said pairs of IDT electrodes adjoining said reflector has an electrode-finger pitch progressively decreased from a region away from said reflector toward said reflector, wherein said reflectors are provided in a plural number whereas said IDT electrode is sandwiched between a pair of reflectors, said IDT electrode having the electrode-finger pitch progressively decreased from the center thereof toward the opposite ends thereof.

7. A surface acoustic wave device having one or more stages of resonator-type electrode patterns arranged on a piezoelectric substrate along a propagation direction of a surface acoustic wave, and input and output terminals connected to said resonator-type electrode pattern, said resonator-type electrode pattern comprising: a plurality of IDT electrodes each including electrode fingers extended perpendicularly to the propagation direction of the surface acoustic wave; and a reflector interposed between a pair of IDT electrodes spaced from each other along said propagation direction of the surface acoustic wave, said reflector including four or more electrode fingers extended perpendicularly to said propagation direction of the surface acoustic wave and arranged with an electrode-finger pitch progressively decreased from the opposite ends of the reflector toward the center thereof, wherein at least one of said pairs of IDT electrodes adjoining said reflector bas an electrode-finger pitch progressively decreased from a region away from said reflector toward said reflector, wherein as to said reflector and said IDT electrode in adjoining relation with respect to said propagation direction, an average value of the electrode-finger pitch of said IDT electrode is greater than the maximum value of the electrode-finger pitch of said reflector.

8. A surface acoustic wave device having one or more stages of resonator-type electrode patterns arranged on a piezoelectric substrate along a propagation direction of a surface acoustic wave, and input and output terminals connected to said resonator-type electrode pattern, said resonator-type electrode pattern comprising: a plurality of IDT electrodes each including electrode fingers extended perpendicularly to the propagation direction of the surface acoustic wave; and a reflector interposed between a pair of IDT electrodes spaced from each other along said propagation direction of the surface acoustic wave, at least one of said pair of IDT electrodes adjoining said reflector having an electrode-finger pitch progressively decreased from a region away from said reflector toward said reflector wherein said reflectors are provided in a plural number whereas said IDT electrode is sandwiched between a pair of reflectors, wherein said IDT electrode has the electrode-finger pitch progressively decreased from the center thereof toward the opposite ends thereof.

9. A surface acoustic wave device according to claim 8, wherein one or more different resonator-type electrode patterns for mode resonance generation are added in series or in parallel to said resonator-type electrode pattern.

10. A communication apparatus comprising at least one of or both of a receiver circuit and a transmitter circuit including the surface acoustic wave device according to claim 8.

11. A surface acoustic wave device according to claim 8, wherein said reflector and a bus bar of said IDT electrode in adjoining relation therewith with respect to said propagation direction of the surface acoustic wave are electrically interconnected.

12. A surface acoustic wave device having one or more stages of resonator-type electrode patterns arranged on a piezoelectric substrate along a propagation direction of a surface acoustic wave, and input and output terminals connected to said resonator-type electrode pattern, wherein said resonator-type electrode pattern comprises: five or more IDT electrodes each including electrode fingers extended perpendicularly to the propagation direction of the surface acoustic wave; and a reflector interposed between a pair of IDT electrodes spaced from each other along said propagation direction of the surface acoustic wave and including four or more electrode fingers extended perpendicularly to said propagation direction, wherein out of said five or more IDT electrodes, a central IDT electrodes and outermost IDT electrodes have an equal electrode-finger pitch, whereas an IDT electrode (hereinafter, referred to as "second IDT electrode") between said central IDT electrode and said outermost IDT electrode has an electrode finger pitch which is smaller than an electrode-finger pitch of said central IDT electrode and said outermost IDT electrode and is progressively decreased from the opposite ends of said second IDT electrode toward the center thereof.

13. A communication apparatus comprising at least one of or both of a receiver circuit and a transmitter circuit including the surface acoustic wave device according to claim 12.

14. A surface acoustic wave device according to claim 12, wherein said reflector has an electrode-finger pitch progressively decreased from a region away from said second IDT electrode adjacent thereto toward said second IDT electrode.

15. A surface acoustic wave device according to claim 12, wherein said outermost IDT electrodes have the electrode-finger pitch progressively decreased from a region away from said central IDT toward said central IDT.

16. A surface acoustic wave device according to claim 15, wherein said central IDT electrode has the electrode-finger pitch progressively decreased from the center thereof toward the opposite ends thereof.

17. A surface acoustic wave device according to claim 15, wherein the maximum value of the electrode-finger pitch of said second IDT electrode is smaller than an average value of the electrode-finger pitch of the reflector adjacent thereto.

18. A surface acoustic wave device according to claim 13, wherein said reflector and a bus bar of at lest one of said pairs of IDT electrode in adjoining relation therewith with respect to the propagation direction of the surface acoustic wave are electrically interconnected.

19. A surface acoustic wave device according to claim 12, wherein one or more different resonator-type electrode patterns for mode resonance generation are added in series or in parallel to said resonator-type electrode pattern.

20. A surface acoustic wave device having one or more stages of resonator-type electrode patterns arranged on a piezoelectric substrate along a propagation direction of a surface acoustic wave, and input and output terminals connected to said resonator-type electrode pattern, said resonator-type electrode pattern comprising: a plurality of IDT electrodes each including electrode fingers extended perpendicularly to the propagation direction of the surface acoustic wave; and a reflector interposed between a pair of IDT electrodes spaced from each other along said propagation direction of the surface acoustic wave, at least one of said pair of IDT electrodes adjoining said reflector having an electrode-finger pitch progressively decreased from a region away from said reflector toward said reflector, wherein as to said reflector and said IDT electrode in adjoining relation with respect to said propagation direction of the surface acoustic wave, an average value of the electrode-finger pitch of said IDT electrode is greater than the maximum value of an electrode-finger pitch of said reflector.

21. A surface acoustic wave device according to claim 20, wherein said reflector and a bus bar of said IDT electrode in adjoining relation therewith with respect to said propagation direction of the surface acoustic wave are electrically interconnected.

22. A surface acoustic wave device according to claim 20, wherein one or more different resonator-type electrode patterns for mode resonance generation are added in series or in parallel to said resonator-type electrode pattern.

* * * * *